US010935884B2

(12) United States Patent
Chiba et al.

(10) Patent No.: US 10,935,884 B2
(45) Date of Patent: Mar. 2, 2021

(54) PATTERN FORMING METHOD AND METHODS FOR MANUFACTURING PROCESSED SUBSTRATE, OPTICAL COMPONENT AND QUARTZ MOLD REPLICA AS WELL AS COATING MATERIAL FOR IMPRINT PRETREATMENT AND SET THEREOF WITH IMPRINT RESIST

(71) Applicant: CANON KABUSHIKI KAISHA, Tokyo (JP)

(72) Inventors: Keiko Chiba, Utsunomiya (JP); Shingo Ishida, Utsunomiya (JP); Toshiaki Ando, Utsunomiya (JP); Toshiki Ito, Kawasaki (JP); Timothy Brian Stachowiak, Austin, TX (US); Weijun Liu, Cedar Park, TX (US)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/556,836

(22) Filed: Aug. 30, 2019

(65) Prior Publication Data
US 2019/0391484 A1 Dec. 26, 2019

Related U.S. Application Data

(63) Continuation of application No. PCT/JP2018/008040, filed on Mar. 2, 2018.
(Continued)

(51) Int. Cl.
*H01L 21/00* (2006.01)
*G03F 7/00* (2006.01)
*H01L 21/027* (2006.01)

(52) U.S. Cl.
CPC ........ *G03F 7/0002* (2013.01); *H01L 21/0271* (2013.01)

(58) Field of Classification Search
CPC .................... G03F 7/0002; H01L 21/0271
See application file for complete search history.

(56) References Cited

U.S. PATENT DOCUMENTS 6,696,220 B2    2/2004 Bailey et al.
6,842,229 B2    1/2005 Sreenivasan et al.
(Continued)

FOREIGN PATENT DOCUMENTS

JP      2009-083172 A     4/2009
JP      2010-87528 A      4/2010
(Continued)

OTHER PUBLICATIONS

Otani et al., U.S. Appl. No. 16/548,371, filed Aug. 22, 2019.
(Continued)

*Primary Examiner* — Richard A Booth
(74) *Attorney, Agent, or Firm* — Venable LLP

(57) ABSTRACT

The pattern forming method, which is a photo-nanoimprint technology, includes in this order: laying a layer formed of a curable composition (A1) containing at least a polymerizable compound on a surface of a substrate; dispensing liquid droplets of a curable composition (A2) containing at least a polymerizable compound dropwise discretely onto the layer of (A1) to lay the liquid droplets; sandwiching a layer obtained by partially mixing (A1) and (A2) between a mold and the substrate; of irradiating the layer obtained by partially mixing (A1) and (A2) with light from a side of the mold to cure the layer in one stroke; and releasing the mold from the layer formed of the curable compositions after the curing, in which a value Vr/Vc obtained by dividing a volume of (A2) per shot area (Vr) by a volume of (A1) (Vc) is 4 or more and 15 or less.

17 Claims, 4 Drawing Sheets

Related U.S. Application Data

(60) Provisional application No. 62/468,472, filed on Mar. 8, 2017.

(56) References Cited

U.S. PATENT DOCUMENTS

| | | |
|---|---|---|
| 6,870,301 B2 | 3/2005 | Choi et al. |
| 6,873,087 B1 | 3/2005 | Choi et al. |
| 6,902,853 B2 | 6/2005 | Sreenivasan et al. |
| 6,916,585 B2 | 7/2005 | Sreenivasan et al. |
| 6,919,152 B2 | 7/2005 | Sreenivasan et al. |
| 6,921,615 B2 | 7/2005 | Sreenivasan et al. |
| 6,922,906 B2 | 8/2005 | Choi et al. |
| 6,955,868 B2 | 10/2005 | Choi et al. |
| 6,986,975 B2 | 1/2006 | Sreenivasan et al. |
| 7,060,324 B2 | 6/2006 | Bailey et al. |
| 7,060,402 B2 | 6/2006 | Choi et al. |
| 7,098,572 B2 | 8/2006 | Choi et al. |
| 7,157,036 B2 | 1/2007 | Choi et al. |
| 7,186,483 B2 | 3/2007 | Sreenivasan et al. |
| 7,229,273 B2 | 6/2007 | Bailey et al. |
| 7,303,383 B1 | 12/2007 | Sreenivasan et al. |
| 7,307,118 B2 | 12/2007 | Xu et al. |
| 7,374,415 B2 | 5/2008 | Choi et al. |
| 7,387,508 B2 | 6/2008 | Choi et al. |
| 7,432,634 B2 | 10/2008 | Choi et al. |
| 7,690,212 B2 * | 4/2010 | Narayanamurthy .. F25B 41/062 62/222 |
| 7,701,112 B2 | 4/2010 | Choi et al. |
| 7,708,542 B2 | 5/2010 | Bailey et al. |
| 7,837,921 B2 | 11/2010 | Xu et al. |
| 8,033,814 B2 | 10/2011 | Bailey et al. |
| 8,133,427 B2 | 3/2012 | Tada et al. |
| 8,142,703 B2 | 3/2012 | Xu et al. |
| 8,152,511 B2 | 4/2012 | Xu et al. |
| 8,268,220 B2 | 9/2012 | Xu et al. |
| 8,361,336 B2 * | 1/2013 | Okushima ............. B29C 33/424 216/44 |
| 8,387,482 B2 | 3/2013 | Choi et al. |
| 8,562,896 B2 | 10/2013 | Ishii et al. |
| 8,609,326 B2 | 12/2013 | Sreenivasan et al. |
| 8,672,661 B2 * | 3/2014 | Minoda ................. B82Y 40/00 425/174.4 |
| 8,679,357 B2 | 3/2014 | Wakamatsu et al. |
| 9,223,202 B2 | 12/2015 | Choi et al. |
| 9,507,263 B2 | 11/2016 | Kodama et al. |
| 9,946,158 B2 | 4/2018 | Takei et al. |
| 10,182,500 B2 | 1/2019 | Honma et al. |
| 10,191,375 B2 | 1/2019 | Oomatsu et al. |
| 10,246,605 B2 | 4/2019 | Oomatsu et al. |
| 10,338,467 B2 | 7/2019 | Ito et al. |
| 2002/0094496 A1 | 7/2002 | Choi et al. |
| 2004/0149687 A1 | 8/2004 | Choi et al. |
| 2004/0163563 A1 | 8/2004 | Sreenivasan et al. |
| 2005/0064344 A1 | 3/2005 | Bailey et al. |
| 2005/0160011 A1 | 7/2005 | Sreenivasan et al. |
| 2005/0160934 A1 | 7/2005 | Xu et al. |
| 2005/0274219 A1 | 12/2005 | Choi et al. |
| 2005/0275311 A1 | 12/2005 | Choi et al. |
| 2006/0005657 A1 | 1/2006 | Choi et al. |
| 2006/0108710 A1 | 5/2006 | Xu et al. |
| 2006/0115999 A1 | 6/2006 | Sreenivasan et al. |
| 2006/0279024 A1 | 12/2006 | Xu et al. |
| 2007/0272825 A1 | 11/2007 | Xu et al. |
| 2008/0095878 A1 | 4/2008 | Bailey et al. |
| 2009/0011139 A1 | 1/2009 | Sreenivasan et al. |
| 2009/0025246 A1 | 1/2009 | Choi et al. |
| 2009/0037004 A1 | 2/2009 | Choi et al. |
| 2009/0214689 A1 | 8/2009 | Bailey et al. |
| 2010/0154993 A1 | 6/2010 | Choi et al. |
| 2011/0042345 A1 | 2/2011 | Choi et al. |
| 2011/0215503 A1 | 9/2011 | Xu et al. |
| 2012/0128891 A1 | 5/2012 | Takei et al. |
| 2014/0349086 A1 | 11/2014 | Ito et al. |
| 2017/0066208 A1 | 3/2017 | Khusnatdinov et al. |
| 2017/0068159 A1 | 3/2017 | Khusnatdinov et al. |
| 2017/0068161 A1 | 3/2017 | Stachowiak et al. |
| 2017/0283620 A1 | 10/2017 | Otani et al. |
| 2017/0283632 A1 | 10/2017 | Chiba et al. |
| 2017/0285462 A1 | 10/2017 | Ito |
| 2017/0285463 A1 | 10/2017 | Ito et al. |
| 2017/0285464 A1 | 10/2017 | Ito et al. |
| 2017/0285465 A1 | 10/2017 | Iimura et al. |
| 2017/0285466 A1 | 10/2017 | Chiba et al. |
| 2018/0039170 A1 | 2/2018 | Kato et al. |
| 2018/0272634 A1 | 9/2018 | Khusnatdinov et al. |
| 2018/0275511 A1 | 9/2018 | Stachowiak et al. |
| 2019/0030785 A1 | 1/2019 | Kato et al. |

FOREIGN PATENT DOCUMENTS

| | | |
|---|---|---|
| JP | 2010-258182 A | 11/2010 |
| JP | 2011-159924 A | 8/2011 |
| JP | 2011-168003 A | 9/2011 |
| JP | 2011-187824 A | 9/2011 |
| JP | 1791357 B2 | 10/2011 |
| JP | 2011-235571 A | 11/2011 |
| JP | 2012-69762 A | 4/2012 |
| JP | 2013-93552 A | 5/2013 |
| JP | 2013-122044 A | 6/2013 |
| JP | 2015-179806 A | 10/2015 |
| JP | 2016-6843 A | 1/2016 |
| JP | 2016-164977 A | 9/2016 |
| JP | 2017-55108 A | 3/2017 |
| WO | 2005/000552 A2 | 1/2005 |
| WO | 2011/013630 A1 | 2/2011 |
| WO | 2016/027843 A1 | 2/2016 |
| WO | 2016/031879 A1 | 3/2016 |
| WO | 2018/051961 A1 | 3/2018 |
| WO | 2018/163995 A1 | 9/2018 |
| WO | 2018/164015 A1 | 9/2018 |
| WO | 2018/164016 A1 | 9/2018 |
| WO | 2018/164017 A1 | 9/2018 |

OTHER PUBLICATIONS

Ito et al., U.S. Appl. No. 16/552,815, filed Aug. 27, 2019.
Kato et al., U.S. Appl. No. 16/555,429, filed Aug. 29, 2019.
U.S. Appl. No. 16/548,371, WO 2018/164015.
U.S. Appl. No. 16/552,815, WO 2018/164016.
U.S. Appl. No. 16/555,429, WO 2018/164017.
International Search Report in International Application No. PCT/JP2018/008040 (dated May 15, 2018).
Article 19 Amendment in International Application No. PCT/JP2018/008040 (dated Jul. 12, 2018).
Informal Comments in International Application No. PCT/JP2018/008040 (dated Jul. 12, 2018).
Shravanthi Reddy et al., "Simulation of Fluid Flow in the Step and Flash Imprint Lithography Process," 82 Microelectron Eng. 60-70 (Jul. 2005).
Nobuyuki Imaishi, "Fundamental of the Marangoni Convection," Int. J. Microgravity Sci. No. 31 Supplement, pp. S5-S12 (2014).
International Preliminary Report on Patentability in International Application No. PCT/JP2018/008040 (dated Sep. 19, 2019).
Office Action in Taiwanese Application No. 107107549 (dated Feb. 15, 2019).
Notice of Preliminary Rejection in Korean Application No. 10-2019-7028266 (dated Aug. 2020).

* cited by examiner

US 10,935,884 B2

PATTERN FORMING METHOD AND METHODS FOR MANUFACTURING PROCESSED SUBSTRATE, OPTICAL COMPONENT AND QUARTZ MOLD REPLICA AS WELL AS COATING MATERIAL FOR IMPRINT PRETREATMENT AND SET THEREOF WITH IMPRINT RESIST

CROSS-REFERENCE TO RELATED APPLICATIONS

This application is a Continuation of International Patent Application No. PCT/JP2018/008040, filed Mar. 2, 2018, which claims the benefit of U.S. Provisional Patent Application No. 62/468,472, filed Mar. 8, 2017, both of which are hereby incorporated by reference herein in their entirety.

BACKGROUND OF THE INVENTION

Field of the Invention

The present invention relates to a pattern forming method, methods for manufacturing a processed substrate, an optical component, and a quartz mold replica each including using the method, and a coating material for imprint pretreatment and a set thereof with an imprint resist.

Description of the Related Art

There has been a growing requirement for miniaturization in a semiconductor device, a MEMS, or the like, and hence a photo-nanoimprint technology has been attracting attention as a microfabrication technology. In the photo-nanoimprint technology, a photocurable composition (resist) is cured in a state in which a mold having a fine groove/land pattern formed on its surface is pressed against a substrate (wafer) having applied thereto the photocurable composition. Thus, the groove/land pattern of the mold is transferred onto the cured film of the photocurable composition and hence the pattern is formed on the substrate. According to the photo-nanoimprint technology, a fine structural body of the order of several nanometers can be formed on the substrate.

A method for forming pattern by a photo-nanoimprint technology disclosed in Japanese Patent No. 4791357 is described with reference to a schematic sectional view of FIG. 1. First, a liquid curable composition (resist) 102 is dispensed dropwise discretely onto a pattern forming area on a substrate 101 by using an inkjet method (arranging step, FIG. 1(1)). Liquid droplets of the curable composition 102 dispensed dropwise spread on the substrate 101 as indicated by arrows 104 each indicating the direction in which a liquid droplet spreads (FIG. 1(1)). The phenomenon is called prespread. Next, the curable composition 102 is molded with a mold 105 that has a pattern formed thereon and is transparent to irradiation light 106 to be described later (mold contacting step, FIG. 1(2)). In the mold contacting step, the liquid droplets of the curable composition 102 spread over the entire region of a gap between the substrate 101 and the mold 105 (FIG. 1(2)). The phenomenon is called spread. In addition, in the mold contacting step, the curable composition 102 is filled into a groove portion on the mold 105 as indicated by arrows 104 each indicating the direction in which a liquid droplet spreads by the capillary phenomenon (expanded part of FIG. 1(2)). The filling phenomenon is called fill. A time period required for the spread and the fill to be completed is called a filling time. After the completion of the filling of the curable composition 102, the curable composition 102 is cured by being irradiated with irradiation light 106 (light irradiating step, FIG. 1(3)), and then released (releasing step, FIG. 1(4)). The performance of those steps results in the formation of a cured film (photocured film) 107 having a predetermined shape on the substrate. When the curable composition 102 is arranged discretely in an imprint apparatus in accordance with the density of a desired pattern like this system instead of prior formation of the curable composition 102 as a uniform film on the substrate 101 before its introduction into the imprint apparatus, a fine pattern having higher accuracy can be formed.

The photo-nanoimprint technology disclosed in Japanese Patent No. 4791357 has involved a problem in that a time period (filling time) from the initiation of the contact of the mold to the completion of the spread and the fill is long, and hence throughput is low.

In view of the foregoing, the inventors of the present invention have devised a photo-nanoimprint technology having a short filling time, in other words, high throughput (short spread time nanoimprint lithography, hereinafter referred to as "SST-NIL"). As illustrated in the schematic sectional views of FIG. 2, the SST-NIL is a technology obtaining a cured film 207 having pattern shapes that includes:

a laying step 1 (step (1)) of laying a liquid curable composition (A1) 202 on a substrate 201 so that the composition may have a uniform thickness;

a laying step 2 (step (2)) of laying liquid droplets of a curable composition (A2) 203 discretely on the layer of the curable composition (A1) 202 in an imprint apparatus;

a mold contacting step (step (3)) of sandwiching a layer consisting of the mixture 208 obtained by mixing the curable composition (A1) 202 and the curable composition (A2) 203 between a mold 205 and the substrate 201;

a light irradiating step (step (4)) of irradiating the layer consisting of the mixture 208 obtained by mixing the curable composition (A1) 202 and the curable composition (A2) 203 with irradiation light 206 from a side of the mold 205 to cure the layer in one stroke; and a releasing step (step (5)) of releasing the mold 205 from the layer formed of the curable compositions after the curing.

In the SST-NIL, a series of step units ranging from the step (2) to the step (5) is referred to as "shot", and an area where the mold 205 is in contact with the curable composition (A1) 202 and the curable composition (A2) 203, in other words, an area where a pattern is formed on the substrate 201 is referred to as "shot area".

In the SST-NIL, the liquid droplets of the curable composition (A2) 203 dispensed dropwise discretely expand quickly on the liquid film of the curable composition (A1) 202, and hence a filling time is short and throughput is high. A detailed mechanism for the SST-NIL is described later. The laying step 1 of laying the curable composition (A1) 202 does not affect the throughput of the imprint apparatus because the step is performed outside the imprint apparatus or in another chamber in the imprint apparatus.

In addition, in each of Japanese Patent Application Laid-Open No. 2011-159924, Japanese Patent Application Laid-Open No. 2011-168003, Japanese Patent Application Laid-Open No. 2011-187824, and Japanese Patent Application Laid-Open No. 2011-235571, there is a proposal of a step involving using two kinds of curable compositions. However, in each of the literatures, there is no disclosure of an approach involving arranging a composition discretely in accordance with the density of a pattern through the use of an inkjet system in a laying step 2 of laying the composition to manufacture a high-accuracy pattern. That is, the SST-NIL is a new approach to a photo-nanoimprint that achieves both high pattern accuracy and high throughput performance with two kinds of curable compositions.

However, the SST-NIL illustrated in FIG. 2 involves the following problem. That is, as illustrated in the schematic sectional views of FIG. 3, a curable composition (A1) 302 is laid on a substrate 301 by using, for example, a spin coating method so as to occupy an area wider than a shot area, such as the entire surface of the substrate (FIG. 3(1)). Meanwhile, a curable composition (A2) 303 is laid discretely only in the shot area by using, for example, an inkjet method (FIG. 3(2)). The dispensed liquid droplets of the curable composition ($\alpha$2) 303 are quickly spread (prespread) by the Marangoni effect as indicated by arrows 304 each indicating the direction in which a liquid droplet spreads (FIG. 3(2)). Here, the curable composition (A1) 302 and the curable composition (A2) 303 are different compositions, and are mixed in a period from a laying step 2 (FIG. 3(2)) to a light irradiating step (FIG. 3(4)). At this time, an area 309 in which the curable compositions (A1) 202 and the curable composition (A2) 203 is insufficiently mixed exists (FIG. 3(3)). It has been found that in such cases, the thickness of an area where the curable composition (A1) 302 is present at a high concentration (boundary area between the liquid droplets of the curable composition (A2) 303 becomes less than the thickness of an area where the mixture 308 obtained by mixing the curable composition (A1) 302 and the curable composition (A2) 303 is cured. As a result, it has also been found that the thickness of a cured film 307 having pattern shape becomes nonuniform. When the thickness of the cured film 307 having pattern shape is nonuniform, the following problem occurs: when a base substrate is processed by dry etching or the like, the substrate cannot be uniformly processed.

In order to avoid such problem as described above, the mixing of the curable compositions (A1) and the curable composition (A2) needs to be sufficiently performed. In order to diffuse the curable composition (A2) into the curable composition (A1), it is effective to bring the curable composition (A1) and the curable composition (A2) into contact with each other for a long time period. However, when a long time period is taken for the mixing, a time period for one shot lengthens and hence a problem in that throughput remarkably reduces occurs.

In view of the foregoing, an object of the present invention is to provide a SST-NIL technology that provides high throughput and can process a shot area with uniform accuracy.

SUMMARY OF THE INVENTION

In order to solve the above-mentioned problem, according to one embodiment of the present invention, there is provided a pattern forming method, including in this order: a step (1) of laying a layer formed of a curable composition (A1) containing at least a component (a1) serving as a polymerizable compound on a surface of a substrate; a step (2) of dispensing liquid droplets of a curable composition (A2) containing at least a component (a2) serving as a polymerizable compound dropwise discretely onto the layer of the curable composition (A1) to lay the liquid droplets; a step (3) of sandwiching a layer obtained by partially mixing the curable composition (A1) and the curable composition (A2) between a mold and the substrate; a step (4) of irradiating the layer obtained by mixing the curable composition (A1) and the curable composition (A2) with light from a side of the mold to cure the layer in one stroke; and a step (5) of releasing the mold from the layer formed of the curable compositions after the curing, in which a value Vr/Vc obtained by dividing a volume (Vr) of the curable composition (A2) per shot area by a volume (Vc) of the curable composition (A1) is 4 or more and 15 or less.

Further features of the present invention will become apparent from the following description of exemplary embodiments with reference to the attached drawings.

DESCRIPTION OF THE EMBODIMENTS

[Curable Composition]

Figure 1:
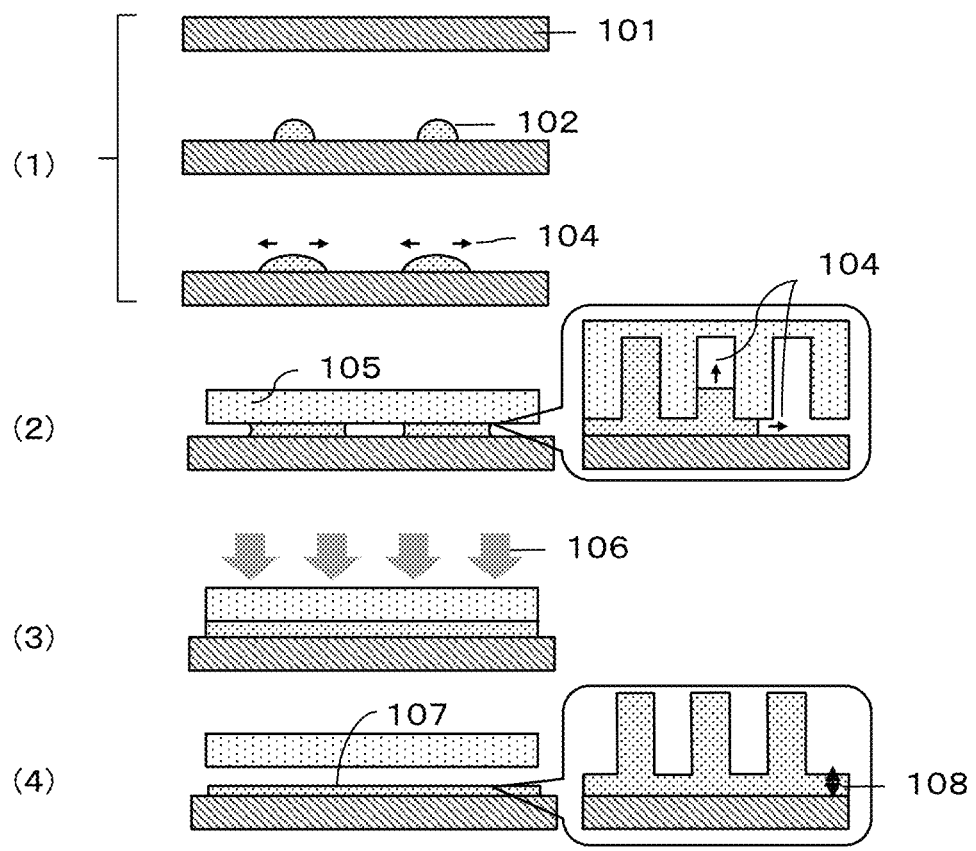
FIG. 1 is a schematic sectional view for illustrating a precedent for a photo-nanoimprint technology.

Curable compositions (A1) and the curable composition (A2) (hereinafter, both also referred to as "curable composition (A)") according to this embodiment are each a compound containing at least a component (a) serving as a polymerizable compound. The curable compositions according to this embodiment may each further contain a component (b) serving as a photopolymerization initiator, a non-polymerizable compound (c), or a component (d) serving as a solvent. Here, each components contained in the curable compositions (A1) are referred as a component (a1) to a component (d1), each components contained in the curable compositions (A2) are referred as a component (a2) to a component (d2).

In addition, the term cured film as used herein means a film obtained by polymerizing and curing a curable composition (A) on a substrate. The shape of the cured film is not particularly limited, and the film may have a pattern shape on its surface.

Each component is hereinafter described in detail.

<Component (a): Polymerizable Compound>

The component (a) serving as a polymerizable compound as used herein is a compound that reacts with a polymerization factor (such as a radical) generated from a component (b) serving as the photopolymerization initiator to form a film formed of a polymer compound by a chain reaction (polymerization reaction).

As such polymerizable compound, there is given, for example, a radical polymerizable compound. The component (a) serving as the polymerizable compound may be formed of only one kind of polymerizable compound or a plurality of kinds of polymerizable compounds.

It is preferred that the radical polymerizable compound be a compound having one or more acryloyl groups or methacryloyl groups, that is, a (meth)acrylic compound. Therefore, it is preferred that the curable composition (A) according to the present invention contains the (meth)acrylic compound as the component (a), it is more preferred that a main component for the component (a) be consisted of the (meth)acrylic compound, and it is most preferred that the component (a) be the (meth)acrylic compound. The phrase "a main component for the component (a) is the (meth) acrylic compound" described herein means that the (meth) acrylic compound accounts for 90 wt % or more of the component (a).

When the radical polymerizable compound is formed of a plurality of kinds of compounds each having one or more acryloyl groups or methacryloyl groups, the compound preferably contains a monofunctional (meth)acrylic monomer and a multifunctional (meth)acrylic monomer. This is because the combination of the monofunctional (meth) acrylic monomer and the multifunctional (meth)acrylic monomer provides a cured film having a high mechanical strength.

Monofunctional (meth)acrylic compounds each having one acryloyl group or methacryloyl group are exemplified by, but not limited to, phenoxyethyl (meth)acrylate, phenoxy-2-methylethyl (meth)acrylate, phenoxyethoxyethyl (meth)acrylate, 3-phenoxy-2-hydroxypropyl (meth)acrylate, 2-phenylphenoxyethyl (meth)acrylate, 4-phenylphenoxyethyl (meth)acrylate, 3-(2-phenylphenyl)-2-hydroxypropyl (meth)acrylate, EO-modified p-cumylphenyl (meth)acrylate, 2-bromophenoxyethyl (meth)acrylate, 2,4-dibromophenoxyethyl (meth)acrylate, 2,4,6-tribromophenoxyethyl (meth)acrylate, EO-modified phenoxy (meth)acrylate, PO-modified phenoxy (meth)acrylate, polyoxyethylene nonylphenyl ether (meth)acrylate, isobornyl (meth)acrylate, 1-adamantyl (meth)acrylate, 2-methyl-2-adamantyl (meth) acrylate, 2-ethyl-2-adamantyl (meth)acrylate, bornyl (meth) acrylate, tricyclodecanyl (meth)acrylate, dicyclopentanyl (meth)acrylate, dicyclopentenyl (meth)acrylate, cyclohexyl (meth)acrylate, 4-butylcyclohexyl (meth)acrylate, acryloyl morpholine, 2-hydroxyethyl (meth)acrylate, 2-hydroxypropyl (meth)acrylate, 2-hydroxybutyl (meth)acrylate, methyl (meth)acrylate, ethyl (meth)acrylate, propyl (meth)acrylate, isopropyl (meth)acrylate, butyl (meth)acrylate, amyl (meth) acrylate, isobutyl (meth)acrylate, t-butyl (meth)acrylate, pentyl (meth)acrylate, isoamyl (meth)acrylate, hexyl (meth) acrylate, heptyl (meth)acrylate, octyl (meth)acrylate, isooctyl (meth)acrylate, 2-ethylhexyl (meth)acrylate, nonyl (meth)acrylate, decyl (meth)acrylate, isodecyl (meth)acrylate, undecyl (meth)acrylate, dodecyl (meth)acrylate, lauryl (meth)acrylate, stearyl (meth)acrylate, isostearyl (meth) acrylate, benzyl (meth)acrylate, tetrahydrofurfuryl (meth) acrylate, butoxyethyl (meth)acrylate, ethoxy diethylene glycol (meth)acrylate, polyethylene glycol mono(meth) acrylate, polypropylene glycol mono(meth)acrylate, methoxy ethylene glycol (meth)acrylate, ethoxyethyl (meth) acrylate, methoxy polyethylene glycol (meth)acrylate, methoxy polypropylene glycol (meth)acrylate, diacetone (meth)acrylamide, isobutoxymethyl (meth)acrylamide, N,N-dimethyl (meth)acrylamide, t-octyl (meth)acrylamide, dimethylaminoethyl (meth)acrylate, diethylaminoethyl (meth)acrylate, 7-amino-3,7-dimethyloctyl (meth)acrylate, N,N-diethyl (meth)acrylamide, and N,N-dimethylaminopropyl (meth)acrylamide.

Examples of commercial products corresponding to the monofunctional (meth)acrylic compounds include, but not limited to: ARONIX (trademark) M101, M102, M110, M111, M113, M117, M5700, TO-1317, M120, M150, and M156 (all of which are manufactured by Toagosei Co., Ltd.); MEDOL10, MIBDOL10, CHDOL10, MMDOL30, MEDOL30, MIBDOL30, CHDOL30, LA, IBXA, 2-MTA, HPA, and Viscoat #150, #155, #158, #190, #192, #193, #220, #2000, and #2150 (all of which are manufactured by Osaka Organic Chemical Industry Ltd.); LIGHT ACRYLATE BO-A, EC-A, DMP-A, THF-A, HOP-A, HOA-MPE, HOA-MPL, PO-A, P-200A, NP-4EA, and NP-BEA, and EPDXY ESTER M-600A (all of which are manufactured by Kyoeisha Chemical Co., Ltd.); KAYARAD (trademark) TC110S, R-564, and R-128H (all of which are manufactured by Nippon Kayaku Co., Ltd.); NK Ester AMP-10G and AMP-20G (both of which are manufactured by Shin-Nakamura Chemical Co., Ltd.); FA-511A, 512A, and 513A (all of which are manufactured by Hitachi Chemical Co., Ltd.); PHE, CEA, PHE-2, PHE-4, BR-31, BR-31M, and BR-32 (all of which are manufactured by DKS); VP (manufactured by BASF); and ACMO, DMAA, and DMAPAA (all of which are manufactured by Kohjin Co., Ltd.).

In addition, multifunctional (meth)acrylic compounds each having two or more acryloyl groups or methacryloyl groups are exemplified by, but not limited to, trimethylolpropane di(meth)acrylate, trimethylolpropane tri(meth)acrylate, EO-modified trimethylolpropane tri(meth)acrylate, PO-modified trimethylolpropane tri(meth)acrylate, EO,PO-modified trimethylolpropane tri(meth)acrylate, dimethyloltricyclodecane di(meth)acrylate, pentaerythritol tri(meth)acrylate, pentaerythritol tetra(meth)acrylate, ethylene glycol di(meth)acrylate, tetraethylene glycol di(meth) acrylate, polyethylene glycol di(meth)acrylate, polypropylene glycol di(meth)acrylate, 1,4-butanediol di(meth) acrylate, 1,6-hexanediol di(meth)acrylate, neopentyl glycol di(meth)acrylate, 1,9-nonanediol di(meth)acrylate, 1,10-decanediol di(meth)acrylate, 1,3-adamantane dimethanol di(meth)acrylate, tris(2-hydroxyethyl)isocyanurate tri(meth) acrylate, tris(acryloyloxy)isocyanurate, bis(hydroxymethyl) tricyclodecane di(meth)acrylate, dipentaerythritol penta(meth)acrylate, dipentaerythritol hexa(meth)acrylate, EO-modified 2,2-bis(4-((meth)acryloxy)phenyl)propane, PO-modified 2,2-bis(4-((meth)acryloxy)phenyl)propane, and EO,PO-modified 2,2-bis(4-((meth)acryloxy)phenyl) propane.

Examples of commercial products corresponding to the multifunctional (meth)acrylic compounds include, but not limited to: YUPIMER (trademark) UV SA1002 and SA2007 (both of which are manufactured by Mitsubishi Chemical Corporation); Viscoat #195, #230, #215, #260, #335HP, #295, #300, #360, #700, GPT, and 3PA (all of which are manufactured by Osaka Organic Chemical Industry Ltd.); LIGHT ACRYLATE 4EG-A, 9EG-A, NP-A, DCP-A, BP-4EA, BP-4PA, TMP-A, PE-3A, PE-4A, and DPE-6A (all of which are manufactured by Kyoeisha Chemical Co., Ltd.); KAYARAD (trademark) PET-30, TMPTA, R-604, DPHA, DPCA-20, -30, -60, and -120, and HX-620, D-310, and D-330 (all of which are manufactured by Nippon Kayaku Co., Ltd.); ARONIX (trademark) M208, M210, M215, M220, M240, M305, M309, M310, M315, M325, and M400 (all of which are manufactured by Toagosei Co., Ltd.); and Ripoxy (trademark) VR-77, VR-60, and VR-90 (all of which are manufactured by Showa Denko KK).

In the above-mentioned compound group, the term "(meth)acrylate" means an acrylate or a methacrylate having an alcohol residue equal to the acrylate. The term "(meth) acryloyl group" means an acryloyl group or a methacryloyl group having an alcohol residue equal to the acryloyl group. The abbreviation "EO" refers to ethylene oxide, and the term "EO-modified compound A" means a compound in which a (meth)acrylic acid residue and an alcohol residue of the compound A are bonded to each other through a block structure consisting of oligomer or polymer of an ethylene oxide group. Further, the abbreviation "PO" refers to propylene oxide, and the term "PO-modified compound B" means a compound in which a (meth)acrylic acid residue and an alcohol residue of the compound B are bonded to each other through a block structure consisting of oligomer or polymer of a propylene oxide group.

The blending ratio of the component (a1) serving as a polymerizable compound in the curable composition (A1) is desirably 50 wt % or more and 100 wt % or less with respect to the total weight of the component (a1), the component (b1), and the component (c1), i.e., the total weight of the components of the curable composition (A1) except the component (d1). In addition, the blending ratio is preferably 80 wt % or more and 100 wt % or less, more preferably more than 90 wt % and 100 wt % or less.

When the blending ratio of the component (a1) serving as a polymerizable compound in the curable composition (A1) is set to 50 wt % or more with respect to the total weight of the component (a1), the component (b1), and the component (c1), a cured film to be obtained can be turned into a cured film having some degree of mechanical strength.

The blending ratio of the component (a2) serving as a polymerizable compound in the curable composition (A2) is desirably 50 wt % or more and 99.9 wt % or less with respect to the total weight of the component (a2), the component (b2), and the component (c2), i.e., the total weight of the components of the curable composition (A2) except the component (d2). In addition, the blending ratio is preferably 80 wt % or more and 99 wt % or less, more preferably more than 90 wt % and 98 wt % or less.

When the blending ratio of the component (a2) serving as a polymerizable compound in the curable composition (A2) is set to 50 wt % or more with respect to the total weight of the component (a2), the component (b2), and the component (c2), a cured film to be obtained can be turned into a cured film having some degree of mechanical strength.

In addition, as described later, the curable composition (A1) preferably contains the component (d1), and the content of the component (a1) is desirably 0.01 wt % or more and 10 wt % or less with respect to the total weight of the components of the curable composition (A1) including the component (d1).

<Component (b): Photopolymerization Initiator>

The component (b) serving as a photopolymerization initiator as used herein is a compound that detects light having a predetermined wavelength to generate the above-mentioned polymerization factor (radical). Specifically, the photopolymerization initiator is a polymerization initiator (radical generator) that generates a radical with light (an infrared ray, a visible ray, an ultraviolet ray, a far ultraviolet ray, an X-ray, charged particle rays such as an electron beam, a radial ray). The component (b) may be formed of one kind of photopolymerization initiator or a plurality of kinds of photopolymerization initiators.

Examples of the radical generator include, but not limited to: 2,4,5-triarylimidazole dimers that may have a substituent, such as a 2-(o-chlorophenyl)-4,5-diphenylimidazole dimer, a 2-(o-chlorophenyl)-4,5-di(methoxyphenyl)imidazole dimer, a 2-(o-fluorophenyl)-4,5-diphenylimidazole dimer, and a 2-(o- or p-methoxyphenyl)-4,5-diphenylimidazole dimer; benzophenone and benzophenone derivatives, such as N,N'-tetramethyl-4,4'-diaminobenzophenone (Michler's ketone), N,N'-tetraethyl-4,4'-diaminobenzophenone, 4-methoxy-4'-dimethylaminobenzophenone, 4-chlorobenzophenone, 4,4'-dimethoxybenzophenone, and 4,4'-diaminobenzophenone; α-amino aromatic ketone derivatives, such as 2-benzyl-2-dimethylamino-1-(4-morpholinophenyl)-butanone-1, and 2-methyl-1-[4-(methylthio)phenyl]-2-morpholino-propan-1-one; quinones, such as 2-ethylanthraquinone, phenanthrenequinone, 2-t-butylanthraquinone, octamethylanthraquinone, 1,2-benzanthraquinone, 2,3-benzanthraquinone, 2-phenylanthraquinone, 2,3-diphenylanthraquinone, 1-chloroanthraquinone, 2-methylanthraquinone, 1,4-naphthoquinone, 9,10-phenanthraquinone, 2-methyl-1,4-naphthoquinone, and 2,3-dimethylanthraquinone; benzoin ether derivatives, such as benzoin methyl ether, benzoin ethyl ether, and benzoin phenyl ether; benzoin and benzoin derivatives, such as methylbenzoin, ethylbenzoin, and propylbenzoin; benzyl derivatives, such as benzyl dimethyl ketal; acridine derivatives, such as 9-phenylacridine and 1,7-bis(9,9'-acridinyl)heptane; N-phenylglycine derivatives, such as N-phenylglycine; acetophenone and acetophenone derivatives, such as 3-methylacetophenone, acetophenone benzyl ketal, 1-hydroxycyclohexyl phenyl ketone, and 2,2-dimethoxy-2-phenylacetophenone; thioxanthone and thioxanthone derivatives, such as diethylthioxanthone, 2-isopropylthioxanthone, and 2-chlorothioxanthone; acylphosphine oxide derivatives, such as 2,4,6-trimethylbenzoyl diphenyl phosphine oxide, bis(2,4,6-trimethylbenzoyl) phenyl phosphine oxide, and bis-(2,6-dimethoxybenzoyl)-2,4,4-trimethylpentyl phosphine oxide; oxime ester derivatives, such as 1,2-octanedione, 1-[4-(phenylthio)-, 2-(O-benzoyloxime)] and ethanone, 1-[9-ethyl-6-(2-methylbenzoyl)-9H-carbazol-3-yl]-, 1-(O-acetyloxime); xanthone; fluorenone; benzaldehyde; fluorene; anthraquinone; triphenylamine; carbazole; 1-(4-isopropylphenyl)-2-hydroxy-2-methylpropan-1-one; and 2-hydroxy-2-methyl-1-phenylpropan-1-one.

Examples of commercial products corresponding to the radical generator include, but not limited to, Irgacure (trademark) 184, 369, 651, 500, 819, 907, 784, and 2959, 4265, CGI-1700, -1750, and -1850, CG24-61, Darocur 1116 and 1173, Lucirin (trademark) TPO, LR8893, and LR8970 (all of which are manufactured by BASF), and Ubecryl P36 (manufactured by UCB).

Of those, the component (b) is preferably an acylphosphine oxide-based polymerization initiator. The acylphosphine oxide-based polymerization initiator is, of the examples described above, an acylphosphine oxide compound, such as 2,4,6-trimethylbenzoyl diphenyl phosphine oxide, bis(2,4,6-trimethylbenzoyl) phenyl phosphine oxide, or bis(2,6-dimethoxybenzoyl)-2,4,4-trimethylpentyl phosphine oxide.

In the present invention, it is preferred that the curable composition (A1) be substantially free of photoreactivity. To this end, the blending ratio of the component (b1) serving as a photopolymerization initiator in the curable composition (A1) is preferably set to less than 0.1 wt % with respect to the total weight of the component (a1), the component (b1), and the component (c1), i.e., the total weight of the components of the curable composition (A1) except the component (d1). In addition, the blending ratio is more preferably 0.01 wt % or less.

When the blending ratio of the component (b1) is set to less than 0.1 wt % with respect to the total weight of the component (a1), the component (b1), and the component (c1), the curable composition (A1) is substantially free of photoreactivity. Accordingly, a risk in that the curable composition (A1) laid in an adjacent shot area is cured by irradiation light leaked to the adjacent shot area in a light irradiating step is alleviated, and hence a pattern having a small number of non-filling defects is obtained also in the adjacent shot area even in a short filling time. The curing reaction of the curable composition (A1) in the shot area is described later.

The blending ratio of the component (b2) serving as a photopolymerization initiator in the curable composition (A2) is desirably 0.1 wt % or more and 50 wt % or less with respect to the total weight of the component (a2), the component (b2), and the component (c2), i.e., the total weight of the components of the curable composition (A2) except the component (d2). In addition, the blending ratio is preferably 0.1 wt % or more and 20 wt % or less, more preferably more than 10 wt % and 20 wt % or less.

When the blending ratio of the component (b2) in the curable composition (A2) is set to 0.1 wt % or more with respect to the total weight of the component (a2), the component (b2), and the component (c2), the curing rate of the composition increases and hence reaction efficiency can be improved. In addition, when the blending ratio of the component (b2) is set to 50 wt % or less with respect to the total of the component (a2), the component (b2), and the component (c2), a cured film to be obtained can be turned into a cured film having some degree of mechanical strength.

<Component (c): Non-Polymerizable Compound>

The curable compositions (A1) and (A2) according to the present invention can each further contain the component (c) serving as a non-polymerizable compound in addition to the component (a) and the component (b) described in the foregoing in accordance with various purposes to the extent that the effects of the present invention are not impaired. Such component (c) is, for example, a compound that is free of a polymerizable functional group, such as a (meth) acryloyl group, and is free of an ability to sense light having a predetermined wavelength to generate the polymerization factor (radical). Examples thereof include a sensitizer, a hydrogen donor, an internal release agent, a surfactant, an antioxidant, a polymer component, and other additives. Two or more kinds of the compounds may be incorporated as the component (c).

The sensitizer is a compound to be appropriately added for the purpose of accelerating a polymerization reaction or enhancing a reaction conversion ratio. As the sensitizer, there is given, for example, a sensitizing dye. The sensitizing dye is a compound that is excited by absorbing light having a specific wavelength to interact with the component (b) serving as the photopolymerization initiator. The term "interaction" described herein refers to, for example, the transfer of energy or an electron from the sensitizing dye in an excited state to the component (b) serving as the photopolymerization initiator.

Specific examples of the sensitizing dye include, but not limited to, an anthracene derivative, an anthraquinone derivative, a pyrene derivative, a perylene derivative, a carbazole derivative, a benzophenone derivative, a thioxanthone derivative, a xanthone derivative, a coumarin derivative, a phenothiazine derivative, a camphorquinone derivative, an acridine-based dye, a thiopyrylium salt-based dye, a merocyanine-based dye, a quinoline-based dye, a styrylquinoline-based dye, a ketocoumarin-based dye, a thioxanthene-based dye, a xanthene-based dye, an oxonol-based dye, a cyanine-based dye, a rhodamine-based dye, and a pyrylium salt-based dye. Preferred specific examples of the sensitizing dye include N,N'-tetraethyl-4,4'-diaminobenzophenone serving as a benzophenone derivative, 2-isopropylthioxanthone serving as a thioxanthone derivative, and 7-diethylamino-4-methylcoumarin serving as a ketocoumarin-based dye.

The sensitizers may be used alone or as a mixture thereof.

The hydrogen donor is a compound capable of reacting with an initiation radical generated from the component (b) serving as the photopolymerization initiator or the radical of a polymerization growth terminal to generate a more reactive radical. The hydrogen donor is preferably added when the component (b) serving as the photopolymerization initiator is a photoradical generator.

Specific examples of such hydrogen donor include, but not limited to, amine compounds, such as n-butylamine, di-n-butylamine, allylthiourea, triethylamine, triethylenetramine, a 4,4'-bis(dialkylamino)benzophenone, N,N-dimethylaminobenzoic acid ethyl ester, N,N-dimethylaminobenzoic acid isoamyl ester, pentyl-4-dimethylaminobenzoate, triethanolamine, and N-phenylglycine, and mercapto compounds, such as 2-mercapto-N-phenylbenzimidazole and a mercaptopropionic acid ester, sulfur compounds, such as s-benzylisothiuronium-p-toluenesulfinate, and phosphorous compounds, such as tri-n-butylphosphine.

The hydrogen donors may be used alone or as a mixture thereof. In addition, the hydrogen donor may have a function as a sensitizer.

The internal release agent can be added to each of the curable compositions for the purpose of reducing an interfacial bonding force between a mold and a cured product of the curable composition (A), i.e., reducing a release force in a releasing step to be described later. The term "internal" as used herein means that the release agent is added to the curable composition (A) prior to the step of arranging the curable composition (A).

For example, surfactants, such as a silicone-based surfactant, a fluorine-based surfactant, and a hydrocarbon surfactant, can each be used as the internal release agent. In the present invention, the internal release agent is free of polymerizability.

Examples of the fluorine-based surfactant include a polyalkylene oxide (such as polyethylene oxide or polypropylene oxide) adduct of an alcohol having a perfluoroalkyl group, and a polyalkylene oxide (such as polyethylene oxide or polypropylene oxide) adduct of perfluoropolyether. The fluorine-based surfactant may have, for example, a hydroxyl group, an alkoxy group, an alkyl group, an amino group, or a thiol group on part (for example, as a terminal group) of its molecular structure.

As the fluorine-based surfactant, a commercial product may be used. Examples of the commercial product include MEGAFACE (trademark) F-444, TF-2066, TF-2067, and TF-2068 (all of which are manufactured by DIC Corporation), Fluorad FC-430 and FC-431 (both of which are manufactured by 3M Japan Limited), SURFLON (trademark) S-382 (manufactured by AGC), EFTOP EF-122A, 122B, and 122C, EF-121, EF-126, EF-127, and MF-100 (all of which are manufactured by Mitsubishi Materials Electronic Chemicals Co., Ltd.), PF-636, PF-6320, PF-656, and PF-6520 (all of which are manufactured by OMNOVA Solutions), UNIDYNE (trademark) DS-401, DS-403, and DS-451 (all of which are manufactured by Daikin Industries, Ltd.), and Ftergent (trademark) 250, 251, 222F, and 208G (all of which are manufactured by Neos Corporation).

In addition, the internal release agent may be the hydrocarbon surfactant. The hydrocarbon surfactant includes, for example, an alkyl alcohol polyalkylene oxide adduct, in which an alkylene oxide having 2 to 4 carbon atoms is added to an alkyl alcohol having 1 to 50 carbon atoms.

Examples of the alkyl alcohol polyalkylene oxide adduct include a methyl alcohol polyethylene oxide adduct, a decyl alcohol polyethylene oxide adduct, a lauryl alcohol polyethylene oxide adduct, a cetyl alcohol polyethylene oxide adduct, a stearyl alcohol polyethylene oxide adduct, and a stearyl alcohol polyethylene oxide/propylene oxide adduct. The terminal group of the alkyl alcohol polyalkylene oxide adduct is not limited to a hydroxyl group, which is simply produced by adding a polyalkylene oxide to an alkyl alcohol. The hydroxyl group may be substituted with another substituent, for example, a polar functional group, such as a carboxyl group, an amino group, a pyridyl group, a thiol group, or a silanol group, or a hydrophobic functional group, such as an alkyl group or an alkoxy group.

As the alkyl alcohol polyalkylene oxide adduct, a commercial product may be used. Examples of the commercial product include polyoxyethylene methyl ether (methyl alcohol polyethylene oxide adduct) (BLAUNON MP-400, MP-550, and MP-1000) manufactured by Aoki Oil Industrial Co., Ltd., polyoxyethylene decyl ether (decyl alcohol polyethylene oxide adduct) (FINESURF D-1303, D-1305, D-1307, and D-1310) manufactured by Aoki Oil Industrial Co., Ltd., polyoxyethylene lauryl ether (lauryl alcohol polyethylene oxide adduct) (BLAUNON EL-1505) manufactured by Aoki Oil Industrial Co., Ltd., polyoxyethylene cetyl ether (cetyl alcohol polyethylene oxide adduct) (BLAUNON CH-305 and CH-310) manufactured by Aoki Oil Industrial Co., Ltd., polyoxyethylene stearyl ether (stearyl alcohol polyethylene oxide adduct) (BLAUNON SR-705, SR-707, SR-715, SR-720, SR-730, and SR-750) manufactured by Aoki Oil Industrial Co., Ltd., random polymerization-type polyoxyethylene polyoxypropylene stearyl ether (BLAUNON SA-50/50 1000R and SA-30/70 2000R) manufactured by Aoki Oil Industrial Co., Ltd., polyoxyethylene methyl ether (Pluriol (trademark) A760E) manufactured by BASF, and polyoxyethylene alkyl ethers (EMULGEN Series) manufactured by Kao Chemicals.

Of those hydrocarbon surfactants, an alkyl alcohol polyalkylene oxide adduct is preferred as the internal release agent, and a long-chain alkyl alcohol polyalkylene oxide adduct is more preferred. The internal release agents may be used alone or as a mixture thereof.

The blending ratio of the component (c) serving as a non-polymerizable compound in each of the curable compositions (A) is desirably 0 wt % or more and 50 wt % or less with respect to the total weight of the component (a), the component (b), and the component (c), i.e., the total weight of components of the curable compositions (A) except the component (d). In addition, the blending ratio is preferably 0.1 wt % or more and 50 wt % or less, more preferably 0.1 wt % or more and 20 wt % or less. When the blending ratio of the component (c) is set to 50 wt % or less with respect to the total weight of the component (a), the component (b), and the component (c), a cured film to be obtained can be turned into a cured film having some degree of mechanical strength.

<Component (d): Solvent>

The curable compositions (A) according to this embodiment may each contain the component (d) serving as a solvent. The component (d) is not particularly limited as long as the component is a solvent that dissolves the component (a), the component (b), and the component (c). The solvent is preferably a solvent having a boiling point at normal pressure of 80° C. or more and 200° C. or less. The solvent is more preferably a solvent having at least one of an ester structure, a ketone structure, a hydroxyl group, or an ether structure. The solvent is specifically, for example, a single solvent selected from propylene glycol monomethyl ether acetate, propylene glycol monomethyl ether, cyclohexanone, 2-heptanone, γ-butyrolactone, and ethyl lactate, or a mixed solvent of two or more kinds thereof.

The curable composition (A1) according to this embodiment preferably contains the component (d1). This is because, as described later, a spin coating method is preferred as a method of applying the curable composition (A1) onto the substrate.

<Temperature at Time of Blending of Curable Composition (A)>

When the curable compositions (A1) and (A2) of this embodiment are prepared, each components are mixed and dissolved under a predetermined temperature condition. Specifically, the preparation is performed in a range of from 0° C. or more to 100° C. or less.

<Viscosity of Curable Composition (A)>

The curable compositions (A1) and (A2) according to the present invention are preferably liquid. This is because in a mold contacting step to be described later, the spread and fill of the curable composition (A1) and/or the curable composition (A2) are quickly completed, in other words, a filling time is short.

The viscosity of the mixture of the components except the solvent (component (d1)) of the curable composition (A1) according to the present invention at 25° C. is preferably 1 mPa·s or more and 1,000 mPa·s or less. In addition, the viscosity is more preferably 1 mPa·s or more and 500 mPa·s or less, still more preferably 1 mPa·s or more and 100 mPa·s or less.

The viscosity of the mixture of the components except the solvent (component (d2)) of the curable composition (A2) according to the present invention at 25° C. is preferably 1 mPa·s or more and 100 mPa·s or less. In addition, the viscosity is more preferably 1 mPa·s or more and 50 mPa·s or less, still more preferably 1 mPa·s or more and 12 mPa·s or less.

When the viscosities of the curable compositions (A1) and (A2) are set to 100 mPa·s or less, spread and fill are quickly completed at the time of the bringing of the curable compositions (A1) and (A2) into contact with the mold (S. Reddy, R. T. Bonnecaze/Microelectronic Engineering, 82 (2005) 60-70). In other words, when the curable compositions according to the present invention are used, a photo-nanoimprint method can be performed at high throughput. In addition, a pattern defect due to a filling failure hardly occurs.

In addition, when the viscosities are set to 1 mPa·s or more, application unevenness hardly occurs at the time of the application of the curable compositions (A1) and (A2) onto the substrate. Further, when the curable compositions (A1) and (A2) are brought into contact with the mold, the curable compositions (A1) and (A2) hardly flow out of an end portion of the mold.

<Surface Tension of Curable Composition (A)>

With regard to the surface tension of each of the curable compositions (A1) and the curable composition (A2) according to this embodiment, the surface tension of the composition of the components except the component (d) serving as a solvent at 25° C. is preferably 5 mN/m or more and 70 mN/m or less. In addition, the surface tension is more preferably 7 mN/m or more and 50 mN/m or less, still more preferably 10 mN/m or more and 40 mN/m or less. In this case, as the surface tension becomes higher, e.g., 5 mN/m or more, a stronger capillary force acts, and hence filling (the spread and the fill) is completed within a shorter time period at the time of the bringing of the curable composition (A1) and/or the curable composition (A2) into contact with the mold (S. Reddy, R. T. Bonnecaze/Microelectronic Engineering, 82 (2005) 60-70). In addition, when the surface tension is set to 70 mN/m or less, a cured film obtained by curing the curable compositions becomes a cured film having surface smoothness.

In the present invention, the surface tension of the curable composition (A1) except the component (d1) serving as a solvent is preferably higher than the surface tension of the curable composition (A2) except the component (d2) serving as a solvent. This is because of the following reason. Before the mold contacting step, the prespread of the curable composition (A2) is accelerated (liquid droplets spread over a wide range) by a Marangoni effect to be described later, and hence a time period required for spread in the mold contacting step to be described later is shortened. As a result, a filling time is shortened.

The Marangoni effect is a free surface movement phenomenon resulting from a local difference in surface tension between liquids (N. Imaishi/Int. J. Microgravity Sci. No. 31 Supplement 2014 (S5-S12)). The difference in surface tension, in other words, the difference in surface energy serves as a driving force to cause such diffusion that a liquid having a low surface tension covers a wider surface. In other words, when the curable composition (A1) having a high surface tension is applied to the entire surface of the substrate and the curable composition (A2) having a low surface tension is dispensed dropwise, the prespread of the curable composition (A2) is accelerated.

<Contact Angle of Curable Composition (A)>

With regard to the contact angle of each of the curable compositions (A1) and (A2) according to the present invention, the contact angle of the composition of the components except the component (d) serving as a solvent is preferably 0° or more and 90° or less with respect to each of both the surface of the substrate and the surface of the mold. When the contact angle is more than 90°, a capillary force acts in a negative direction (direction in which a contact interface between the mold and the curable composition is shrunk) in a mold pattern or in a gap between the substrate and the mold, and hence the composition is not filled. In addition, the contact angle is particularly preferably 0° or more and 30° or less. As the contact angle becomes lower, a stronger capillary force acts and hence a filling rate increases (S. Reddy, R. T. Bonnecaze/Microelectronic Engineering, 82 (2005) 60-70).

<Impurities Mixed in Curable Composition (A)>

It is preferred that the curable compositions (A1) and (A2) according to the present invention each be free of impurities to the extent possible. The term "impurities" as used herein refers to components except the component (a), the component (b), the component (c), and the component (d) described above.

Thus, it is preferred that the curable compositions (A) according to the present invention each be obtained through a purification step. The purification step is preferably filtration using a filter or the like. When the filtration using a filter is performed, specifically, it is preferred that the component (a) and the component (b) described in the foregoing and additive components to be added as required be mixed, and then the mixture be filtered with a filter having a pore diameter of, for example, 0.001 µm or more and 5.0 µm or less. It is more preferred that the filtration using a filter be performed in a plurality of stages or be repeated a plurality of times. In addition, the filtered liquid may be filtered again. A plurality of filters having different pore diameters may be used to perform the filtration. A filter made of, for example, a polyethylene resin, a polypropylene resin, a fluororesin, or a nylon resin can be used as the filter to be used in the filtration. However, the filter is not particularly limited thereto.

Impurities, such as particles, which are mixed in the curable compositions (A), can be removed through such purification step. Thus, the impurities, such as the particles, can be prevented from forming unexpected unevenness in the cured film to be obtained after the curable compositions are cured to cause a pattern defect.

When the curable compositions (A) according to the present invention are used for the manufacture of a semiconductor integrated circuit, it is preferred to avoid the mixing of metal atom-containing impurities (metal impurities) in the curable compositions (A) to the extent possible in order to prevent the operation of a product from being inhibited. In this case, the concentration of the metal impurities in the curable compositions (A) is preferably 10 ppm or less, more preferably 100 ppb or less.

[Pattern Forming Method]

Next, a pattern forming method according to the present invention is described with reference to the schematic sectional views of FIG. 2.

The pattern forming method according to the present invention is one mode of the photo-nanoimprint method. The pattern forming method of the present invention includes:

a laying step 1 (step 1) of laying the curable composition (A1) 202 of this embodiment described in the foregoing on the substrate 201;

a laying step 2 (step 2) of laying the curable composition (A2) 203 on the layer of the curable composition (A1) 202;

a mold contacting step (step 3) of sandwiching the layer obtained by partially mixing the curable composition (A1) 202 and the curable composition (A2) 203 between the mold 205 and the substrate 201;

a light irradiating step (step 4) of irradiating the layer obtained by partially mixing the two kinds of curable compositions with irradiation light 206 from a side of the mold to cure the layer in one stroke; and a releasing step (step 5) of releasing the mold 205 from the layer (cured film 207 having pattern shape) formed of the curable compositions after the curing.

The cured film 207 having a pattern shape obtained by the method for manufacturing a cured film according to the present invention is preferably a film having a pattern having a size of 1 nm or more and 10 mm or less. In addition, the cured film is more preferably a film having a pattern having a size of 10 nm or more and 100 µm or less. In general, a pattern forming technology for producing a film having a pattern (uneven structure) of a nanosize (1 nm or more and 100 nm or less) through the use of light is called a photo-nanoimprint method. The pattern forming method according to the present invention uses the photo-nanoimprint method. Each step is hereinafter described.

<Laying Step 1 (Step 1)>

Figure 2:
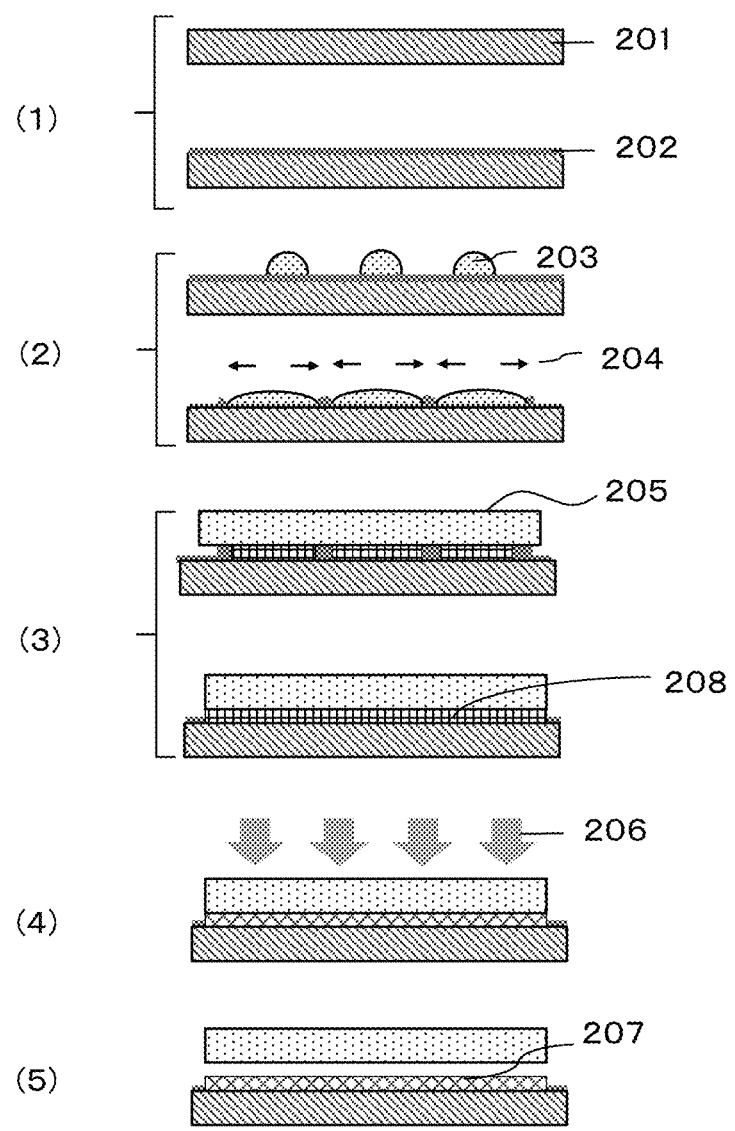
FIG. 2 is a schematic sectional view for illustrating a photo-nanoimprint technology according to the present invention.
Figure 3:
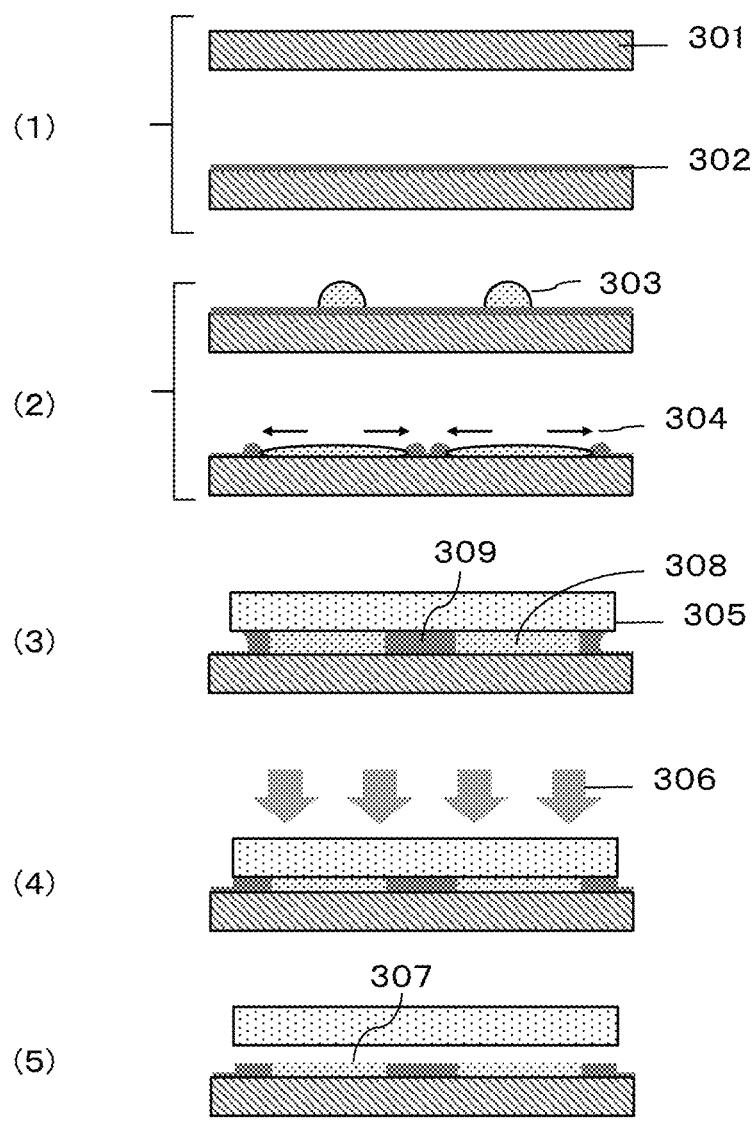
FIG. 3 is a schematic sectional view for illustrating a problem to be solved by the present invention.

In the laying step 1, as illustrated in FIG. 2(1), a curable composition (A1) 202 according to this embodiment described in the foregoing is laid (applied) onto a substrate 201 to form an applied film.

The substrate 201 on which the curable composition (A1) 202 is to be arranged is a substrate to be processed, and a silicon wafer is typically used. A layer to be processed may be formed on the substrate 201. Another layer may be further formed between the substrate 201 and the layer to be processed. In addition, when a quartz substrate is used as the substrate 201, a replica of a quartz imprint mold (quartz mold replica) can be produced.

In the present invention, however, the substrate 201 is not limited to the silicon wafer and the quartz substrate. The substrate 201 can be arbitrarily selected from substrates known as substrates for semiconductor devices, such as aluminum, a titanium-tungsten alloy, an aluminum-silicon alloy, an aluminum-copper-silicon alloy, silicon oxide, and silicon nitride.

The adhesiveness of the surface of the substrate 201 (substrate to be processed) to be used or of the layer to be processed with each of the curable compositions (A1) 202 and the curable composition (A2) 203 may be improved by a surface treatment, such as a silane coupling treatment, a silazane treatment, or the formation of an organic thin film.

In the present invention, as a method of arranging the curable composition (A1) 202 on the substrate 201 or the layer to be processed, there may be used, for example, an inkjet method, a dip coating method, an air knife coating method, a curtain coating method, a wire bar coating method, a gravure coating method, an extrusion coating method, a spin coating method, or a slit scan method. In the present invention, a spin coating method is particularly preferred and a uniform film can be formed.

When the curable composition (A1) 202 is arranged on the substrate 201 or the layer to be processed by using the spin coating method, the component (d1) serving as a solvent may be volatilized by performing a baking step as required.

The average thickness of the curable composition (A1) 202, which varies depending on applications where the cured film is used, is, for example, 2 nm or more and 10,000 nm or less, preferably 2 nm or more and 20 nm or less, particularly preferably 3 nm or more and 5 nm or less.

The method for manufacturing a film having a pattern shape of the present invention enables the following: the curable composition (A1) 202 is collectively laid on most of the surface of the substrate in the step (1), and a repeating unit (shot) including the step (2) to the step (5) is repeatedly performed on the same substrate a plurality of times. The curable composition (A1) 202 formed by using a spin coating method needs to have a thickness of at least 2 nm, preferably 3 nm from the viewpoint of film formability. When the thickness is 2 nm or less, the occurrence of a pinhole or the like cannot be sufficiently prevented.

<Laying Step 2 (Step 2)>

In the laying step 2, as illustrated in FIG. 2(2), liquid droplets of a curable composition (A2) 203 are preferably dispensed dropwise discretely and arranged on the layer of the curable composition (A1) 202. The inkjet method, which is most preferred as a method for the arrangement of the present invention, is used. The liquid droplets of the curable composition (A2) 203 are densely arranged on a substrate facing a region where groove portions are densely present on the mold, and are sparsely arranged on a substrate facing a region where groove portions are sparsely present. Thus, the thickness of a residual film to be described later can be controlled to a uniform value irrespective of the density of a pattern on the mold.

As described in the foregoing, the liquid droplets of the curable composition (A2) 203 arranged in this step (2) are quickly spread as indicated by arrows 204 each indicating the direction in which a liquid droplet spreads by the Marangoni effect using a difference in surface energy (surface tension) as a driving force (prespread) (FIG. 2(2)). The inventors of the present invention have found that in the course of the prespread, the curable composition (A1) 202 and the curable composition (A2) 203 are mixed. When the curable composition (A1) 202 is substantially free of the component (b1) serving as the photopolymerization initiator, as a result of the mixing of the curable composition (A1) 202 and the curable composition (A2) 203, the component (b2) serving as the photopolymerization initiator of the curable composition (A2) 203 migrates to the curable composition (A1) 202, and hence the curable composition (A1) 202 obtains photosensitivity for the first time.

<Mold Contacting Step (Step 3)>

Next, as illustrated in FIG. 2(3), a mold 205 having a template pattern for transferring a pattern shape is brought into contact with a mixture 208 obtained by partially mixing the curable composition (A1) 202 and the curable composition (A2) 203, the mixture 208 being formed in the previous steps (1) and (2) (laying steps 1 and 2). Thus, a groove portion of a fine pattern on the surface of the mold 205 is filled with the mixture 208 obtained by partially mixing the curable composition (A1) 202 and the curable composition (A2) 203, and hence a liquid film filled into the fine pattern of the mold is obtained.

The mold 205 that is formed of an optically transparent material is desirably used as the mold 205 considering the next step (light irradiating step). Preferred specific examples of the material for forming the mold 205 include glass, quartz, an optically transparent resin, such as PMMA or a polycarbonate resin, a transparent metal-deposited film, a flexible film made of polydimethylsiloxane or the like, a photocured film, and a metal film. In the case of using the optically transparent resin as the material for forming the mold 205, it is necessary to select a resin that does not dissolve in a component contained in the curable composition (A1) 202 and the curable composition (A2) 203. Quartz is particularly preferred as the material for forming the mold 205 because of its small thermal expansion coefficient and small pattern deformation.

The fine pattern on the surface of the mold 205 preferably has a pattern height of 4 nm or more and 200 nm or less. As the pattern height becomes lower, the force by which the mold 205 is peeled from the cured film 207 having a pattern shape of a resist in the releasing step, i.e., a release force reduces, and the number of release defects remaining on a mask side owing to the tearing-off of a resist pattern in association with the release reduces. Adjacent resist patterns are brought into contact with each other by the elastic deformation of the resist patterns due to an impact at the time of the peeling of the mold 205, and hence the resist patterns adhere to each other or are damaged in some cases. However, when the pattern height is about twice or less as large as a pattern width (an aspect ratio is 2 or less), there is a high possibility that such inconveniences can be avoided. Meanwhile, when the pattern height is excessively low, the processing accuracy of the substrate to be processed is low.

The mold 205 may be subjected to a surface treatment before this step (3), which is a mold contacting step of the curable compositions (A1) 202 and the curable composition (A2) 203 and the mold 205, so as to enhance the releasability between the curable compositions (A1) 202 and (A2) 203 and the surface of the mold 205. As a method for the surface treatment, there is given a method involving forming a release agent layer by applying a release agent onto the surface of the mold 205. In this case, examples of the release agent to be applied onto the surface of the mold 205 include a silicon-based release agent, a fluorine-based release agent, a hydrocarbon-based release agent, a polyethylene-based release agent, a polypropylene-based release agent, a paraffin-based release agent, a montan-based release agent, and a carnauba-based release agent. For example, a commercially available application-type release agent such as OPTOOL (trademark) DSX manufactured by Daikin Industries, Ltd. can be suitably used. The release agents may be used alone or in combination thereof. Of those, fluorine-based and hydrocarbon-based release agents are particularly preferred.

A pressure to be applied to the curable compositions (A1) 202 and the curable composition (A2) 203 when the mold 205 and the curable compositions (A1) 202 and the curable composition (A2) 203 are brought into contact with each other in the mold contacting step as illustrated in FIG. 2(3) is not particularly limited. The pressure is desirably set to 0 MPa or more and 100 MPa or less. In addition, the pressure is preferably 0 MPa or more and 50 MPa or less, more preferably 0 MPa or more and 30 MPa or less, still more preferably 0 MPa or more and 20 MPa or less.

The prespread of the liquid droplets of the curable composition (A2) 203 has progressed in the previous step (2), and hence the spread of the curable composition (A2) 203 in this step (3) is quickly completed. In a boundary region between the liquid droplets of the curable composition (A2) 203, the spread is finally completed and the concentration of the curable composition (A1) 202 is high. However, as described in the foregoing, the contact angle of the curable composition (A1) 202 is low and hence the fill is quickly completed in the region as well.

As described above, the spread and fill of the curable compositions (A1) 202 and the curable composition (A2) 203 are quickly completed in this step (3), and hence the time period for which the mold 205, and the curable compositions (A1) 202 and the curable composition (A2) 203 are brought into contact with each other can be set to be short. In other words, one of the effects of the present invention is as follows: many pattern forming steps can be completed within a short time period, and hence high productivity is obtained. The time period for which the mold and the compositions are brought into contact with each other, which is not particularly limited, is desirably set to, for example, 0.1 second or more and 600 seconds or less. In addition, the time period is preferably 0.1 second or more and 3 seconds or less, particularly preferably 0.1 second or more and 1.5 seconds or less. When the time period is shorter than 0.1 second, the following tendency is observed: the spread and the fill become insufficient, and hence many defects called non-filling defects occur.

In this step (3), atmosphere control is preferably performed in order to prevent an influence of oxygen or moisture on a curing reaction. When this step (3) is performed under an inert gas atmosphere, specific examples of the inert gas that can be used include nitrogen, carbon dioxide, helium, argon, various fluorocarbon gases, and a mixed gas thereof. A preferred pressure when this step (3) is performed under a particular gas atmosphere including an air atmosphere is 0.0001 atm or more and 10 atm or less.

The mold contacting step may be performed under an atmosphere containing a condensable gas (hereinafter referred to as "condensable gas atmosphere"). The term "condensable gas" as used herein refers to the following gas: when the gas in the atmosphere is filled into a groove portion of the fine pattern formed on the mold 205, and the gap between the mold 205 and the substrate 201 together with the curable compositions (A1) 202 and the curable composition (A2) 203, the gas is condensed by a capillary pressure generated at the time of the filling to liquefy. The condensable gas is present as a gas in the atmosphere before the mixture 208 obtained by the mixing of the curable compositions (A1) 202 and the curable composition (A2) 203, and the mold 205 are brought into contact with each other in the mold contacting step (for reference: expanded part of FIG. 1(2)).

When the mold contacting step is performed under the condensable gas atmosphere, the gas filled into a groove portion of the fine pattern is liquefied by a capillary pressure generated by the curable compositions (A1) 202 and the curable composition (A2) 203, and hence air bubbles disappear. Accordingly, a filling property becomes excellent. The condensable gas may dissolve in the curable composition (A1) 202 and/or the curable composition (A2) 203.

The boiling point of the condensable gas, which is not limited as long as the boiling point is equal to or less than the ambient temperature of the mold contacting step, is preferably from −10° C. to 25° C., more preferably from 10° C. to 25° C. When the boiling point falls within the range, the filling property is more excellent.

The vapor pressure of the condensable gas at the ambient temperature in the mold contacting step, which is not limited as long as the vapor pressure is equal to or less than a mold pressure when impression is performed in the mold contacting step, is preferably from 0.1 MPa to 0.4 MPa. When the vapor pressure falls within the range, the filling property is more excellent. When the vapor pressure at the ambient temperature is more than 0.4 MPa, the following tendency is observed: an air bubble disappearing effect cannot be sufficiently obtained. On the other hand, when the vapor pressure at the ambient temperature is less than 0.1 MPa, the following tendency is observed: decompression is needed and hence an apparatus becomes complicated. The ambient temperature in the mold contacting step, which is not particularly limited, is preferably from 20° C. to 25° C.

Specific examples of the condensable gas include fluorocarbons, such as: a chlorofluorocarbon (CFC), such as trichlorofluoromethane; a fluorocarbon (FC); a hydrochlorofluorocarbon (HCFC); a hydrofluorocarbon (HFC), such as 1,1,1,3,3-pentafluoropropane ($CHF_2CH_2CF_3$, HFC-245fa, PFP); and a hydrofluoroether (HFE), such as pentafluoroethyl methyl ether ($CF_3CF_2OCH_3$, HFE-245mc).

Of those, 1,1,1,3,3-pentafluoropropane (vapor pressure at 23° C.: 0.14 MPa, boiling point: 15° C.), trichlorofluoromethane (vapor pressure at 23° C.: 0.1056 MPa, boiling point: 24° C.), and pentafluoroethyl methyl ether are preferred from such a viewpoint that when the ambient temperature in the mold contacting step is from 20° C. to 25° C., the filling property is excellent. Further, 1,1,1,3,3-pentafluoropropane is particularly preferred from the viewpoint of being excellent in safety.

The condensable gases may be used alone or as a mixture thereof. In addition, any such condensable gas may be mixed with a non-condensable gas, such as air, nitrogen, carbon dioxide, helium, or argon, before use. The non-condensable gas with which the condensable gas is mixed is preferably helium from the viewpoint of the filling property. Helium can permeate the mold 205. Accordingly, when the gases (the condensable gas and helium) in the atmosphere are filled into a groove portion of the fine pattern formed on the mold 205 in the mold contacting step together with the curable composition (A1) 202 and/or the curable composition (A2) 203, the condensable gas liquefies and helium permeates the mold.

<Light Irradiating Step (4)>

Next, as illustrated in FIG. 2(4), a layer of the mixture 208 obtained by mixing the curable composition (A1) 202 and the curable composition (A2) 203 is irradiated with irradiation light 206 from a side of the mold 205. In more detail, the curable composition (A1) 202 and/or the curable composition (A2) 203 filled into the fine pattern of the mold are/is irradiated with the irradiation light 206 through the mold 205. Thus, the curable composition (A1) 202 and/or the curable composition (A2) 203 filled into the fine pattern of the mold 205 are/is cured by the irradiation light 206 to become a cured film 207 having a pattern shape in one stroke.

In this case, irradiation light 206 with which the curable composition (A1) 202 and/or the curable composition (A2) 203 filled into the fine pattern of the mold 205 are/is irradiated is selected depending on the sensitive wavelengths of the curable compositions (A1) 202 and the curable composition (A2) 203. Specifically, it is preferred that UV light having a wavelength of 150 nm or more and 400 nm or less, an X-ray, an electron beam, or the like be appropriately selected and used.

Of those, the irradiation light 206 is particularly preferably UV light. This is because many of the compounds commercially available as curing aids (photopolymerization initiators) have sensitivity to UV light. In this case, examples of the light source of UV light include a high-pressure mercury lamp, an ultra-high pressure mercury lamp, a low-pressure mercury lamp, a Deep-UV lamp, a carbon arc lamp, a chemical lamp, a metal halide lamp, a xenon lamp, a KrF excimer laser, an ArF excimer laser, and a $F_2$ excimer laser. Of those, an ultra-high pressure mercury lamp is particularly preferred. In addition, the number of the light sources to be used may be one or two or more. In addition, the entire surface of the curable composition (A1) 202 and/or the curable composition (A2) 203 filled into the fine pattern of the mold 205 may be irradiated with light, or a part of the surface thereof may be irradiated with light.

In addition, the light irradiation may be performed on an entire region on the substrate 201 intermittently a plurality of times, or may be continuously performed on the entire region. Further, the following may be performed: a partial region A is irradiated with the light in a first irradiating process, and a region B different from the region A is irradiated with the light in a second irradiating process.

In the light irradiating step, as described in the foregoing, leaked light, in other words, the diffusion of the light to the outside of the shot area is inevitable in terms of restrictions on costs for the mold and an apparatus.

In the present invention, when the curable composition (A1) 202 is substantially free of the photopolymerization initiator component (b1) (its content is less than 0.1 wt %), there is little risk in that the curable composition (A1) 202 alone is cured by the light irradiation. Accordingly, there is little risk in that the curable composition (A1) 202 on an adjacent shot area is cured by the leaked light generated from the shot. Accordingly, also in the adjacent shot, a pattern having a small number of non-filling defects can be formed over the entire area thereof in a short filling time.

Meanwhile, in the shot, as described in the foregoing, as a result of the partial mixing of the curable composition (A1) 202 and the curable composition (A2), the photopolymerization initiator (b2) component of the curable composition (A2) 203 migrates to the curable composition (A1) 202, and hence the curable composition (A1) 202 obtains photosensitivity. Accordingly, both the curable compositions (A1) 202 and the curable composition (A2) 203 are cured by the light with which the compositions are cured to form the cured film 207 having a pattern shape by irradiation light 206.

<Releasing Step (5)>

Next, in the releasing step, the cured film 207 having a pattern shape formed of the curable composition (A1) 202 and the curable composition (A3) 203 after the curing and the mold 205 are released from each other. In this step (5), as illustrated in FIG. 2(5), the cured film 207 having a pattern shape and the mold 205 are released from each other.

In the light irradiating step, the cured film 207 having a pattern shape serving as the reverse pattern of the fine pattern formed on the mold 205 is obtained in an independent state. A cured film remains in a groove portion of the groove/land pattern of the cured film 207 having a pattern shape, and the film is called a residual film (for reference: residual film 108 in FIG. 1(4)).

When the mold contacting step is performed under the condensable gas atmosphere, the condensable gas vaporizes in association with a reduction in pressure of the interface at which the cured film 207 having a pattern shape and the mold 205 are in contact with each other at the time of the release of the cured film 207 having a pattern shape and the mold 205 in the releasing step. Thus, a reducing effect on the release force serving as a force needed for releasing the cured film 207 having a pattern shape and the mold 205 from each other tends to be exhibited.

A method of releasing the cured film 207 having a pattern shape and the mold 205 from each other is not particularly limited as long as part of the cured film 207 having a pattern shape is not physically damaged at the time of the release, and various conditions and the like are also not particularly limited. For example, the following may be performed: the substrate 201 (substrate to be processed) is fixed and the mold 205 is peeled by being moved so as to recede from the substrate 201. Alternatively, the following may be performed: the mold 205 is fixed and the substrate 201 is peeled by being moved so as to recede from the mold. Alternatively, both the substrate and the mold may be peeled from each other by being pulled in directions diametrically opposite to each other.

Figure 4:
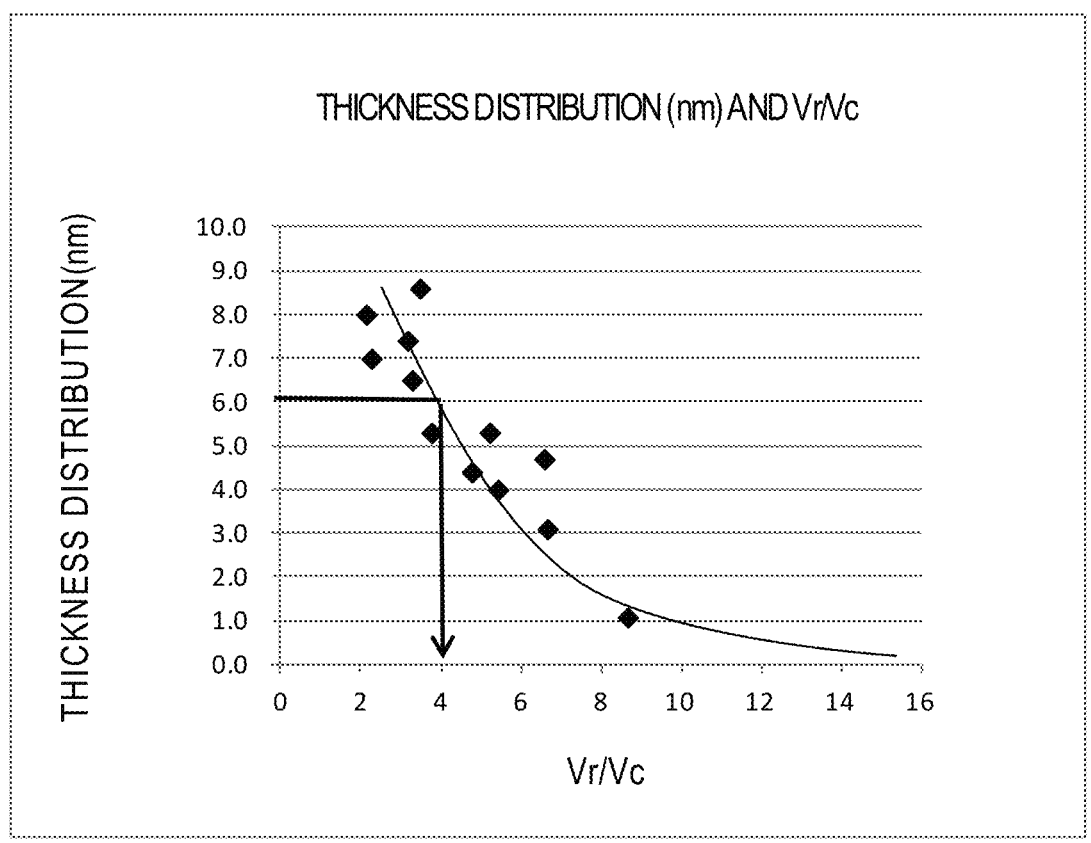
FIG. 4 is a graph for showing a relationship between a Vr/Vc and a thickness distribution according to the present invention.

When the curable composition (A1) 202 is substantially free of the photopolymerization initiator (b1) component, as a result of the mixing of the curable composition (A1) 202 and the curable composition (A2) 203, the photopolymerization initiator (b2) component of the curable composition (A2) 203 migrates to the curable composition (A1) 202, and hence the curable composition (A1) 202 obtains photosensitivity for the first time. Accordingly, the volume of the curable composition (A2) 203 needs to be sufficiently large as compared to the volume of the curable composition (A1) 202. When the mixing is insufficient, a thickness distribution may occur in a cured film to be formed after the filling, curing, and release of the mixture. A correlation between a value obtained by dividing the volume (Vr) of the curable composition (A2) 203 per shot area by the volume (Vc) of the curable composition (A1) 202 and the thickness distribution (difference in thickness between the thickest portion and the thinnest portion) is shown in FIG. 4. The thickness distribution reduced as the Vr/Vc increased. Although the thickness distribution varies depending on a pattern to be formed and accuracy required by a device to be finally processed, in pattern formation at a level of from 10 nm to 100 nm to be formed by a photo-nanoimprint, a cured film is typically formed to have a thickness of from 40 nm to 80 nm or less. Accordingly, a thickness distribution of from 4 nm to 8 nm corresponding to 10% of the thickness is allowed, and a preferred thickness distribution is from 4 nm to 6 nm or less. Accordingly, as can be seen from FIG. 4, the Vr/Vc needs to be 4 or more, preferably 6 or more.

In addition, from the viewpoint of film formability, the liquid film of the curable composition (A1) 202 laid in the laying step 1 needs to have a thickness of at least 2 nm, preferably 3 nm for preventing the occurrence of a pinhole or the like, and hence the Vc cannot be made extremely small. In addition, when the Vr is excessively large, the amount of a dispensed liquid droplet is large and hence a large amount of a residual film remains to adversely affect an etching step serving as a subsequent step. Accordingly, the Vr/Vc is limited to 15 or less, preferably 10 or less. That is, as shown in following general formula (1), Vr/Vc is preferably 4 or more and 15 or less, more preferably 6 or more and 10 or less.

$$4 < Vr/Vc < 15 \qquad \text{general formula (1)}$$

When a shot area is represented by a (mm$^2$), the volume of an imprint resist is represented by Vr (m$^3$), the volume of a coating material is represented by Vc (m$^3$), the applied thickness of the coating material is represented by t (nm), the dispensed amount of the imprint resist is represented by Vd (pL), and the number of times of dispensation is represented by n, Vr=Vd×n and Vc=at.

A cured film 207 having a desired groove/land pattern shape (pattern shape associated with the groove/land shape of the mold 205) at a desired position can be obtained by a series of steps (manufacturing process) including the step (1) to the step (5).

The method for manufacturing a film having a pattern shape of the present invention enables the following: the curable composition (A1) 202 is collectively laid on most of the surface of the substrate 201 in the step (1), and a repeating unit (shot) including the step (2) to the step (5) is repeatedly performed on the same substrate a plurality of times. When the repeating unit (shot) including the step (2) to the step (5) is repeated a plurality of times, a cured film 207 having a plurality of desired groove/land pattern shapes (pattern shapes associated with the groove/land shape of the mold 205) at desired positions of the substrate to be processed can be obtained.

The substrate to be processed or the layer to be processed on the substrate to be processed can be processed into a pattern shape by using: the cured film 207 having a pattern shape obtained through the step (1) to the step (5), the film serving as a mask; and a processing method, such as etching. In addition, after the layer to be processed has been further formed on the cured film 207 having a pattern shape, pattern transfer may be performed by using a processing method, such as etching. Thus, a circuit structure based on the pattern shape of the cured film 207 having the pattern shape can be formed on the substrate 201. Thus, a circuit board to be utilized in a semiconductor element or the like can be produced. In addition, an electronic instrument, such as a display, a camera, or a medical apparatus, can be formed by connecting the circuit board and, for example, a circuit control mechanism for a circuit board. Examples of the semiconductor element as used herein include a LSI, a system LSI, a DRAM, a SDRAM, a RDRAM, a D-RDRAM, and a NAND flash.

An optical component can also be obtained by utilizing the cured film 207 having a pattern shape obtained through the step (1) to the step (5) as an optical member, such as a diffraction grating or a polarizing plate (the case where the film is used as one member of the optical member is included). In such case, an optical component having at least the substrate 201 and the cured film 207 having a pattern shape on the substrate 201 can be obtained.

<Coating Material for Imprint Pretreatment (Curable Compound (A1)) and Imprint Resist (Curable Compound (A2)), and Set Thereof According to another aspect of the present invention described above, there is provided a coating material for imprint pretreatment configured to accelerate, by forming a liquid film serving as a pretreatment coating on a substrate and dispensing a liquid droplet of an imprint resist to the liquid film, the spread of a liquid droplet component in a substrate surface direction.

That is, the present invention includes a coating material for imprint pretreatment including a curable composition (A1), the coating material for imprint pretreatment being configured to accelerate, by forming a liquid film serving as an imprint pretreatment coating on a substrate 201 and dispensing a liquid droplet of an imprint resist formed of a curable composition (A2) to the liquid film becoming the imprint pretreatment coating, the spread of a liquid droplet component in a substrate surface direction, in which: the curable composition (A1) contains at least a component (a1) serving as a polymerizable compound; and the top of the substrate is coated with the coating material for imprint pretreatment so that a value Vr/Vc obtained by dividing a volume Vr of the liquid droplet per shot area by a volume Vc of the coating material for imprint pretreatment may be 4 or more and 15 or less. In addition, it is preferable that the value Vr/Vc of the coating material for imprint pretreatment be 6 or more and 10 or less.

In particular, the surface tension of a composition of a component of the coating material for imprint pretreatment except a solvent is preferably higher than the surface tension of a composition of a component of the imprint resist except a solvent.

Thus, the spread of the liquid droplet component in the substrate surface direction is accelerated by dispensing the liquid droplet to the liquid film, and hence a suitable imprint can be achieved.

In particular, the coating material for imprint pretreatment is preferably provided as a set in which the imprint resist and the coating material for imprint pretreatment are combined with each other.

That is, a suitable imprint is achieved by providing the coating material for imprint pretreatment as a set in which the imprint resist and the coating material for imprint pretreatment are combined with each other so as to satisfy the following relationship: the surface tension of the composition of the components of the coating material for imprint pretreatment except the solvent is higher than the surface tension of the composition of the components of the imprint resist except the solvent.

Further, a set in which the imprint resist and the coating material for imprint pretreatment are combined with each other so that a difference between the surface tension of the composition of the components of the coating material for imprint pretreatment except the solvent and the surface tension of the composition of the components of the imprint resist except the solvent may be 1 mN/m or more and 25 mN/m or less is more preferred.

In addition, according to another aspect of the present invention, there is also provided a suitable pretreatment method for a substrate for performing an imprint by coating the top of the substrate with the coating material for imprint pretreatment.

In addition, the present invention also includes a pattern forming method for forming a pattern on a substrate. When the method includes a step of dispensing a resist dropwise discretely onto the substrate coated with the coating material for imprint pretreatment, the spread of a resist component in a substrate surface direction is accelerated, and hence a time period required for an imprint can be shortened.

EXAMPLES

The present invention is hereinafter described in more detail by way of Examples, but the technical scope of the present invention is not limited to Examples to be described below. The terms "part(s)" and "%" to be used below are by weight in all cases unless otherwise stated.

Example 1

(1) Preparation of Curable Composition (A1-1)

75 Parts by weight of tetraethylene glycol diacrylate (manufactured by Sartomer), 25 parts by weight of tricyclodecane dimethanol diacrylate (manufactured by Sartomer), and 67,000 parts by weight of propylene glycol monomethyl ether acetate (manufactured by Tokyo Chemical Industry Co., Ltd., abbreviation: PGMEA) were blended, and the blend was filtered with a 0.2-micrometer filter made of ultrahigh-molecular weight polyethylene to prepare a curable composition (A1-1) of Example 1.

(2) Measurement of Surface Tension of Curable Composition (A1-1)

The surface tension of a composition except the solvent component of the curable composition (A1-1) at 25° C. was measured with Automatic Surface Tensiometer DY-300 (manufactured by Kyowa Interface Science Co., Ltd.) by a plate method involving using a platinum plate. As a result, the surface tension was 38.5 mN/m. The measurement was performed under the conditions of a number of times of the measurement of 5 and a pre-wet immersion distance of the platinum plate of 0.35 mm. The first measured value was excluded, and the average of the second to fifth measured values was defined as the surface tension.

(3) Preparation of Curable Composition (A2-1)

About 45 parts by weight of monofunctional acrylates (isobornyl acrylate and benzyl acrylate), about 48 parts by weight of a difunctional acrylate (neopentyl glycol diacrylate), about 5 parts by weight of photopolymerization initiators Lucirin (trade mark) TPO and Irgacure (trade mark) 4265, about 0.5 parts by weight of sensitizer (2-isopropylthioxanthone), about 3 parts by weight of a surfactant represented by X—R—(OCH$_2$CH$_2$)$_n$OH (where the surfactant is a mixture of a surfactant in which R represents an alkyl group, an aryl group, or poly(propylene glycol), X represents H or —(OCH$_2$CH$_2$)$_n$OH, and n represents an integer (of from 2 to 20, of from 5 to 15, or of from 10 to 12, and a surfactant in which R represents poly(propylene glycol), X represents —(OCH$_2$CH$_2$)$_n$OH, and n represents from 10 to 12), and a fluorine-based surfactant (that is a fluorine-based surfactant in which all of hydrogen atoms in alkyl group is substituted with fluorine atom) were blended, and the blend was filtered with a 0.2-micrometer filter made of ultrahigh-molecular weight polyethylene to prepare a curable composition (A2-1) of Example 1.

(4) Measurement of Surface Tension of Curable Composition (A2-1)

The surface tension of the curable composition (A2-1) was measured by the same method as that of the curable composition (A1-1). As a result, the surface tension was 31 mN/m.

(5) Photo-Nanoimprint Process

The curable composition (A1-1) was applied onto a silicon substrate with a spin coater to provide a liquid film of the curable composition (A1-1) having a thickness of 3.8 nm. 75,640 Liquid droplets of the curable composition (A2-1) each having a volume of 0.37 pL were arranged discretely on the film of the curable composition (A1-1) in a "shot area" measuring 26 mm by 33 mm by using an inkjet method. At this time, a Vr/Vc was 8.6 and hence satisfied the formula (1). The surface tension of the curable composition (A1-1) arranged in the lower layer was higher than the surface tension of the curable composition (A2-1) dispensed dropwise in the upper layer, and hence the Marangoni effect was expressed and the expansion (prespread) of the liquid droplets of the curable composition (A2-1) was quick. Accordingly, the curable composition (A1-1) and the curable composition (A2-1) were mixed, and the mixture spread in the shot area and was filled into a pattern portion in a time period as short as 1.1 seconds. The mixture was irradiated with light from a UV light source having an intensity of 10,000 W/m2 for 0.1 second, followed by the release of a mold. Thus, a cured film in which the curable composition (A1-1) and the curable composition (A2-1) were mixed was obtained. At that time, a thickness distribution was able to be suppressed to 1.1 nm or less.

In the laying step 2 and the mold contacting step, the curable composition (A1-1) and the curable composition (A2-1) were mixed in a time period as short as 1.1 seconds, and hence a photopolymerization initiator component migrated from the curable composition (A2-1) to the curable composition (A1-1) to cause the curable composition (A1-1) to obtain photopolymerizability. Accordingly, the mixture of the curable composition (A1-1) and the curable composition (A2-1) satisfactorily cured in the light irradiating step.

Example 2

The same compositions as those of Example 1 were used as a curable composition (A1-2) and a curable composition (A2-2).

(5) Photo-Nanoimprint Process

The curable composition (A1-2) was applied onto a silicon substrate with a spin coater to provide a liquid film of the curable composition (A1-2) having a thickness of 3.8 nm. 57,564 Liquid droplets of the curable composition (A2-2) each having a volume of 0.31 pL were arranged discretely on the film of the curable composition (A1-2) in a "shot area" measuring 26 mm by 33 mm by using an inkjet method.

A Vr/Vc was 5.5 and hence satisfied the formula (1). At this time, the surface tension of the curable composition (A1-2) arranged in the lower layer was higher than the surface tension of the curable composition (A2-2) dispensed dropwise in the upper layer, and hence the Marangoni effect was expressed and the expansion (prespread) of the liquid droplets of the curable composition (A2-2) was quick. Accordingly, the curable composition (A1-2) and the curable composition (A2-2) were mixed, and the mixture spread in the shot area and was filled into a pattern portion in a time period as short as 1.1 seconds. The mixture was irradiated with light from a UV light source having an intensity of 10,000 W/m2 for 0.1 second, followed by the release of a mold. Thus, a cured film in which the curable composition (A1-2) and the curable composition (A2-2) were mixed was obtained. At that time, a thickness distribution was able to be suppressed to 4 nm or less.

In the laying step 2 and the mold contacting step, the curable composition (A1-2) and the curable composition (A2-2) were mixed in a time period as short as 1.1 seconds, and hence a photopolymerization initiator component migrated from the curable composition (A2-2) to the curable composition (A1-2) to cause the curable composition (A1-2) to obtain photopolymerizability. Accordingly, the mixture of the curable composition (A1-2) and the curable composition (A2-2) satisfactorily cured in the light irradiating step.

Example 3

The same compositions as those of Example 1 were used as a curable composition (A1-3) and a curable composition (A2-3).

(5) Photo-Nanoimprint Process

The curable composition (A1-3) was applied onto a silicon substrate with a spin coater to provide a liquid film of the curable composition (A1-3) having a thickness of 3.8 nm. 57,564 Liquid droplets of the curable composition (A2-3) each having a volume of 0.37 pL were arranged discretely on the film of the curable composition (A1-3) in a "shot area" measuring 26 mm by 33 mm by using an inkjet method.

A Vr/Vc was 6.5 and hence satisfied the formula (1). At this time, the surface tension of the curable composition (A1-3) arranged in the lower layer was higher than the surface tension of the curable composition (A2-3) dispensed dropwise in the upper layer, and hence the Marangoni effect was expressed and the expansion (prespread) of the liquid droplets of the curable composition (A2-3) was quick. Accordingly, the curable composition (A1-3) and the curable composition (A2-3) were mixed, and the mixture spread in the shot area and was filled into a pattern portion in a time period as short as 1.1 seconds. The mixture was irradiated with light from a UV light source having an intensity of 10,000 W/m2 for 0.1 second, followed by the release of a mold. Thus, a cured film in which the curable composition (A1-3) and the curable composition (A2-3) were mixed was obtained. At that time, a thickness distribution was able to be suppressed to 3.1 nm or less.

In the laying step 2 and the mold contacting step, the curable composition (A1-3) and the curable composition (A2-3) were mixed in a time period as short as 1.1 seconds, and hence a photopolymerization initiator component migrated from the curable composition (A2-3) to the curable composition (A1-3) to cause the curable composition (A1-3) to obtain photopolymerizability. Accordingly, the mixture of the curable composition (A1-3) and the curable composition (A2-3) satisfactorily cured in the light irradiating step.

Example 4

The same compositions as those of Example 1 were used as a curable composition (A1-4) and a curable composition (A2-4).

(5) Photo-Nanoimprint Process

The curable composition (A1-4) was applied onto a silicon substrate with a spin coater to provide a liquid film of the curable composition (A1-4) having a thickness of 3.8 nm. 43,290 Liquid droplets of the curable composition (A2-4) each having a volume of 0.39 pL were arranged discretely on the film of the curable composition (A1-4) in a "shot area" measuring 26 mm by 33 mm by using an inkjet method.

A Vr/Vc was 5.2 and hence satisfied the formula (1). At this time, the surface tension of the curable composition (A1-4) arranged in the lower layer was higher than the surface tension of the curable composition (A2-4) dispensed dropwise in the upper layer, and hence the Marangoni effect was expressed and the expansion (prespread) of the liquid droplets of the curable composition (A2-4) was quick. Accordingly, the curable composition (A1-4) and the curable composition (A2-4) were mixed, and the mixture spread in the shot area and was filled into a pattern portion in a time period as short as 1.1 seconds. The mixture was irradiated with light from a UV light source having an intensity of 10,000 W/m2 for 0.1 second, followed by the release of a mold. Thus, a cured film in which the curable composition (A1-4) and the curable composition (A2-4) were mixed was obtained. At that time, a thickness distribution was able to be suppressed to 5.3 nm or less.

In the laying step 2 and the mold contacting step, the curable composition (A1-4) and the curable composition (A2-4) were mixed in a time period as short as 1.1 seconds, and hence a photopolymerization initiator component migrated from the curable composition (A2-4) to the curable composition (A1-4) to cause the curable composition (A1-4) to obtain photopolymerizability. Accordingly, the mixture of the curable composition (A1-4) and the curable composition (A2-4) satisfactorily cured in the light irradiating step.

Example 5

The same compositions as those of Example 1 were used as a curable composition (A1-5) and a curable composition (A2-5).

(5) Photo-Nanoimprint Process

The curable composition (A1-5) was applied onto a silicon substrate with a spin coater to provide a liquid film of the curable composition (A1-5) having a thickness of 3.8 nm. 43,290 Liquid droplets of the curable composition (A2-5) each having a volume of 0.5 pL were arranged discretely on the film of the curable composition (A1-5) in a "shot area" measuring 26 mm by 33 mm by using an inkjet method.

A Vr/Vc was 6.64 and hence satisfied the formula (1). At this time, the surface tension of the curable composition (A1-5) arranged in the lower layer was higher than the surface tension of the curable composition (A2-5) dispensed dropwise in the upper layer, and hence the Marangoni effect was expressed and the expansion (prespread) of the liquid droplets of the curable composition (A2-5) was quick. Accordingly, the curable composition (A1-5) and the curable composition (A2-5) were mixed, and the mixture spread in the shot area and was filled into a pattern portion in a time period as short as 1.1 seconds. The mixture was irradiated with light from a UV light source having an intensity of 10,000 W/m2 for 0.1 second, followed by the release of a mold. Thus, a cured film in which the curable composition (A1-5) and the curable composition (A2-5) were mixed was obtained. At that time, a thickness distribution was able to be suppressed to 4.7 nm or less.

In the laying step 2 and the mold contacting step, the curable composition (A1-5) and the curable composition (A2-5) were mixed in a time period as short as 1.1 seconds, and hence a photopolymerization initiator component migrated from the curable composition (A2-5) to the curable composition (A1-5) to cause the curable composition (A1-5) to obtain photopolymerizability. Accordingly, the mixture of the curable composition (A1-5) and the curable composition (A2-5) satisfactorily cured in the light irradiating step.

Example 6

The same composition as that of Example 1 was used as a curable composition (A1-6).

(3) Preparation of Curable Composition (A2-6)

About 45 parts by weight of monofunctional acrylates (isobornyl acrylate and benzyl acrylate), about 48 parts by weight of a difunctional acrylate (neopentyl glycol diacrylate), about 5 parts by weight of photopolymerization initiators Lucirin (trade mark) TPO and Irgacure (trade mark) 4265, about 3 parts by weight of a surfactant represented by X—R—(OCH$_2$CH$_2$)$_n$OH (where the surfactant is a mixture of a surfactant in which R represents an alkyl group, an aryl group, or poly(propylene glycol), X represents H or —(OCH$_2$CH$_2$)$_n$OH, and n represents an integer (of from 2 to 20, of from 5 to 15, or of from 10 to 12) and a surfactant in which R represents poly(propylene glycol), X represents —(OCH$_2$CH$_2$)$_n$OH, and n represents from 10 to 12), and a fluorine-based surfactant (that is a fluorine-based surfactant in which all of hydrogen atoms in alkyl group is substituted with fluorine atom) were blended, and the blend was filtered with a 0.2-micrometer filter made of ultrahigh-molecular weight polyethylene to prepare a curable composition (A2-6) of Example 1.

(4) Measurement of Surface Tension of Curable Composition (A2-6)

The surface tension of the curable composition (A2-6) was measured by the same method as that of the curable composition (A1-1). As a result, the surface tension was 31.1 mN/m.

(5) Photo-Nanoimprint Process

The curable composition (A1-6) was applied onto a silicon substrate with a spin coater to provide a liquid film of the curable composition (A1-6) having a thickness of 3 nm. 28,782 Liquid droplets of the curable composition (A2-6) each having a volume of 0.43 pL were arranged discretely on the film of the curable composition (A1-6) in a "shot area" measuring 26 mm by 33 mm by using an inkjet method.

A Vr/Vc was 4.81 and hence satisfied the formula (1). At this time, the surface tension of the curable composition (A1-6) arranged in the lower layer was higher than the surface tension of the curable composition (A2-6) dispensed dropwise in the upper layer, and hence the Marangoni effect was expressed and the expansion (prespread) of the liquid droplets of the curable composition (A2-6) was quick. Accordingly, the curable composition (A1-6) and the curable composition (A2-6) were mixed, and the mixture spread in the shot area and was filled into a pattern portion in a time period as short as 1.1 seconds. The mixture was irradiated with light from a UV light source having an intensity of 10,000 W/m2 for 0.1 second, followed by the release of a mold. Thus, a cured film in which the curable composition (A1-6) and the curable composition (A2-6) were mixed was obtained. At that time, a thickness distribution was able to be suppressed to 4.4 nm or less.

In the laying step 2 and the mold contacting step, the curable composition (A1-6) and the curable composition (A2-6) were mixed in a time period as short as 1.1 seconds, and hence a photopolymerization initiator component migrated from the curable composition (A2-6) to the curable composition (A1-6) to cause the curable composition (A1-6) to obtain photopolymerizability. Accordingly, the mixture of the curable composition (A1-6) and the curable composition (A2-6) satisfactorily cured in the light irradiating step.

Comparative Example 1

The same compositions as those of Example 1 were used as a curable composition (A1-1') and a curable composition (A2-1').

(6) Photo-Nanoimprint Process

The curable composition (A1-1') was applied onto a silicon substrate with a spin coater to provide a liquid film of the curable composition (A1-1') having a thickness of 3.8 nm. 28,782 Liquid droplets of the curable composition (A2-1') each having a volume of 0.38 pL were arranged discretely on the film of the curable composition (A1-1') in a "shot area" measuring 26 mm by 33 mm by using an inkjet method.

A Vr/Vc was 3.35 and hence did not satisfy the formula (1). At this time, the surface tension of the curable composition (A1-1') arranged in the lower layer was higher than the surface tension of the curable composition (A2-1') dispensed dropwise in the upper layer, and hence the Marangoni effect was expressed and the expansion (prespread) of the liquid droplets of the curable composition (A2-1') was quick. The mixture was irradiated with light from a UV light source having an intensity of 10,000 W/m2 for 0.1 second, followed by the release of a mold. Thus, a cured film in which the curable composition (A1-1') and the curable composition (A2-1') were partially mixed was obtained. At that time, a thickness distribution was 8.6 nm and hence the distribution affected a subsequent step.

The foregoing showed that when the Vr/Vc did not satisfy the formula (1), in the laying step 2 and the mold contacting step, the curable composition (A1-1') and the curable composition (A2-1') were not sufficiently mixed in a time period as short as 1.1 seconds.

Comparative Example 2

(1) Preparation of Curable Composition (A1-2')

75 Parts by weight of tetraethylene glycol diacrylate (manufactured by Sartomer), 25 parts by weight of tricyclodecane dimethanol diacrylate (manufactured by Sartomer), and 41,500 parts by weight of propylene glycol monomethyl ether acetate (manufactured by Tokyo Chemical Industry Co., Ltd., abbreviation: PGMEA) serving as a solvent component were blended, and the blend was filtered with a 0.2-micrometer filter made of ultrahigh-molecular weight polyethylene to prepare a curable composition (A1-2') of Example 1.

(2) Measurement of Surface Tension of Curable Composition (A1-2')

The surface tension of a composition except the solvent component of the curable composition (A1-2') at 25° C. was measured with Automatic Surface Tensiometer DY-300 (manufactured by Kyowa Interface Science Co., Ltd.) by a plate method involving using a platinum plate. As a result, the surface tension was 38.5 mN/m. The measurement was performed under the conditions of a number of times of the measurement of 5 and a pre-wet immersion distance of the platinum plate of 0.35 mm. The first measured value was excluded, and the average of the second to fifth measured values was defined as the surface tension.

Meanwhile, the same composition as that of Example 1 was used as a curable composition (A2-2').

(5) Photo-Nanoimprint Process

The curable composition (A1-2') was applied onto a silicon substrate with a spin coater to provide a liquid film of the curable composition (A1-2') having a thickness of 6.2 nm. 57,564 Liquid droplets of the curable composition (A2-2') each having a volume of 0.31 pL were arranged discretely on the film of the curable composition (A1-2') in a "shot area" measuring 26 mm by 33 mm by using an inkjet method.

A Vr/Vc was 3.35 and hence did not satisfy the formula (1). At this time, the surface tension of the curable composition (A1-2') arranged in the lower layer was higher than the surface tension of the curable composition (A2-2') dispensed dropwise in the upper layer, and hence the Marangoni effect was expressed and the expansion (prespread) of the liquid droplets of the curable composition (A2-2') was quick. The mixture was irradiated with light from a UV light source having an intensity of 10,000 W/m2 for 0.1 second, followed by the release of a mold. Thus, a cured film in which the curable composition (A1-2') and the curable composition (A2-2') were partially mixed was obtained. At that time, a thickness distribution was 6.5 nm and hence the distribution affected a subsequent step.

The foregoing showed that when the Vr/Vc did not satisfy the formula (1), in the laying step 2 and the mold contacting step, the curable composition (A1-2') and the curable composition (A2-2') were not sufficiently mixed in a time period as short as 1.1 seconds.

Comparative Example 3

The same compositions as those of Comparative Example 2 were used as a curable composition (A1-3') and a curable composition (A2-3').
(5) Photo-Nanoimprint Process The curable composition (A1-3') was applied onto a silicon substrate with a spin coater to provide a liquid film of the curable composition (A1-3') having a thickness of 6.2 nm. 43,290 Liquid droplets of the curable composition (A2-3') each having a volume of 0.39 pL were arranged discretely on the film of the curable composition (A1-3') in a "shot area" measuring 26 mm by 33 mm by using an inkjet method.

A Vr/Vc was 3.17 and hence did not satisfy the formula (1). At this time, the surface tension of the curable composition (A1-3') arranged in the lower layer was higher than the surface tension of the curable composition (A2-3') dispensed dropwise in the upper layer, and hence the Marangoni effect was expressed and the expansion (prespread) of the liquid droplets of the curable composition (A2-3') was quick. The mixture was irradiated with light from a UV light source having an intensity of 10,000 W/m2 for 0.1 second, followed by the release of a mold. Thus, a cured film in which the curable composition (A1-3') and the curable composition (A2-3') were partially mixed was obtained. At that time, a thickness distribution was 7.4 nm and hence the distribution affected a subsequent step.

The foregoing showed that when the Vr/Vc did not satisfy the formula (1), in the laying step 2 and the mold contacting step, the curable composition (A1-3') and the curable composition (A2-3') were not sufficiently mixed in a time period as short as 1.1 seconds.

Comparative Example 4

The same compositions as those of Comparative Example 2 were used as a curable composition (A1-4') and a curable composition (A2-4').
(5) Photo-Nanoimprint Process The curable composition (A1-4') was applied onto a silicon substrate with a spin coater to provide a liquid film of the curable composition (A1-4') having a thickness of 6.2 nm. 28,782 Liquid droplets of the curable composition (A2-4') each having a volume of 0.38 pL were arranged discretely on the film of the curable composition (A1-4') in a "shot area" measuring 26 mm by 33 mm by using an inkjet method.

A Vr/Vc was 2.06 and hence did not satisfy the formula (1). At this time, the surface tension of the curable composition (A1-4') arranged in the lower layer was higher than the surface tension of the curable composition (A2-4') dispensed dropwise in the upper layer, and hence the Marangoni effect was expressed and the expansion (prespread) of the liquid droplets of the curable composition (A2-4') was quick. The mixture was irradiated with light from a UV light source having an intensity of 10,000 W/m2 for 0.1 second, followed by the release of a mold. Thus, a cured film in which the curable composition (A1-4') and the curable composition (A2-4') were partially mixed was obtained. At that time, a thickness distribution was 8 nm and hence the distribution affected a subsequent step.

The foregoing showed that when the Vr/Vc did not satisfy the formula (1), in the laying step 2 and the mold contacting step, the curable composition (A1-4') and the curable composition (A2-4') were not sufficiently mixed in a time period as short as 1.1 seconds.

Comparative Example 5

The same composition as that of Example 6 was used as a curable composition (A1-5') and the same composition as that of Comparative Example 2 was used as a curable composition (A2-5').
(5) Photo-Nanoimprint Process The curable composition (A1-5') was applied onto a silicon substrate with a spin coater to provide a liquid film of the curable composition (A1-5') having a thickness of 6.2 nm. 28,782 Liquid droplets of the curable composition (A2-5') each having a volume of 0.43 pL were arranged discretely on the film of the curable composition (A1-5') in a "shot area" measuring 26 mm by 33 mm by using an inkjet method.

A Vr/Vc was 2.33 and hence did not satisfy the formula (1). At this time, the surface tension of the curable composition (A1-5') arranged in the lower layer was higher than the surface tension of the curable composition (A2-5') dispensed dropwise in the upper layer, and hence the Marangoni effect was expressed and the expansion (prespread) of the liquid droplets of the curable composition (A2-5') was quick. The mixture was irradiated with light from a UV light source having an intensity of 10,000 W/m2 for 0.1 second, followed by the release of a mold. Thus, a cured film in which the curable composition (A1-5') and the curable composition (A2-5') were partially mixed was obtained. At that time, a thickness distribution was 7 nm and hence the distribution affected a subsequent step.

The foregoing showed that when the Vr/Vc did not satisfy the formula (1), in the laying step 2 and the mold contacting step, the curable composition (A1-5') and the curable composition (A2-5') were not sufficiently mixed in a time period as short as 1.1 seconds.

Summary of Examples and Comparative Examples

The list of Examples 1 to 6 and Comparative Examples 1 to 5 is collectively shown in Table 1.

TABLE 1

| | | Dispensed amount (pL) of curable composition (A2) | Number of times of dispensation of curable composition (A2) | Thickness (nm) of curable composition (A1) | Shot area (mm2) | Vr/Vc | Thickness distribution (nm) | |
|---|---|---|---|---|---|---|---|---|
| | | | | | | | Distribution amount (nm) | Judgment |
| Example 1 | Curable composition (A2) Resist A | 0.37 | 75,640 | 3.8 | 858 | 8.58 | 1.1 | OK |
| Example 2 | | 0.31 | 57,564 | 3.8 | 858 | 5.47 | 4 | OK |
| Example 3 | | 0.37 | 57,564 | 3.8 | 858 | 6.53 | 3.1 | OK |
| Example 4 | | 0.39 | 43,290 | 3.8 | 858 | 5.18 | 5.3 | OK |
| Example 5 | | 0.5 | 43,290 | 3.8 | 858 | 6.64 | 4.7 | OK |
| Comparative Example 1 | | 0.38 | 28,782 | 3.8 | 858 | 3.35 | 8.6 | NG |
| Comparative Example 2 | | 0.31 | 57,564 | 6.2 | 858 | 3.35 | 6.5 | NG |
| Comparative Example 3 | | 0.39 | 43,290 | 6.2 | 858 | 3.17 | 7.4 | NG |
| Comparative Example 4 | | 0.38 | 28,782 | 6.2 | 858 | 2.06 | 8 | NG |
| Comparative Example 5 | Curable composition (A2) Resist B | 0.43 | 28,782 | 6.2 | 858 | 2.33 | 7 | NG |
| Example 6 | | 0.43 | 28,782 | 3 | 858 | 4.81 | 4.4 | OK |

It is shown from the foregoing that when the method of the present invention is used, a photo-nanoimprint pattern can be formed at high throughput and with high accuracy.

According to the present invention, it is possible to provide the pattern forming method that provides high throughput and can process a shot area with uniform accuracy.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. A pattern forming method, comprising in this order:
   a step (1) of laying a layer formed of a curable composition (A1) containing at least a component (a1) serving as a polymerizable compound on a surface of a substrate;
   a step (2) of dispensing liquid droplets of a curable composition (A2) containing at least a component (a2) serving as a polymerizable compound dropwise discretely onto the layer formed of the curable composition (A1) to lay the liquid droplets;
   a step (3) of sandwiching a layer obtained by partially mixing the curable composition (A1) and the curable composition (A2) between a mold and the substrate;
   a step (4) of irradiating the layer obtained by partially mixing the curable composition (A1) and the curable composition (A2) with light from a side of the mold to cure the layer in one stroke; and
   a step (5) of releasing the mold from the layer obtained by partially mixing the curable composition (A1) and the curable composition (A2) after the irradiating,
   wherein a value Vr/Vc obtained by dividing a volume of the curable composition (A2) per shot area (Vr) by a volume of the curable composition (A1) (Vc) is 4 to 15.

2. The pattern forming method according to claim 1, wherein a surface tension of the curable composition (A1), except a component (d1) serving as a solvent, is higher than a surface tension of the curable composition (A2), except a component (d2) serving as a solvent.

3. The pattern forming method according to claim 1, wherein a content of a photopolymerization initiator (b1) in the curable composition (A1) is less than 0.1 wt % with respect to total weight of all of components of the curable composition (A1), except a component (d1) serving as a solvent.

4. The pattern forming method according to claim 1, wherein the value Vr/Vc is 6 to 10.

5. A method for manufacturing a processed substrate, comprising the pattern forming method of claim 1.

6. A method for manufacturing an optical component, comprising the pattern forming method of claim 1.

7. A method for manufacturing a quartz mold replica, comprising the pattern forming method of claim 1.

8. A coating material for imprint pretreatment, comprising a curable composition (A1), the coating material for imprint pretreatment being configured to accelerate, by forming a liquid film serving as an imprint pretreatment coating on a substrate and dispensing a liquid droplet of imprint resist formed of a curable composition (A2) to the liquid film becoming the imprint pretreatment coating, spread of a liquid droplet component in a substrate surface direction, wherein:
   the curable composition (A1) contains at least a component (a1) serving as a polymerizable compound; and
   a top of the substrate is coated with the coating material for imprint pretreatment so that a value Vr/Vc obtained by dividing a volume of the liquid droplet per shot area (Vr) by a volume of the coating for imprint pretreatment (Vc) is 4 to 15.

9. A set, comprising:
   the coating material for imprint pretreatment of claim 8; and
   an imprint resist for being dispensed dropwise onto a substrate coated with the coating material for imprint pretreatment.

10. The set according to claim 9, wherein a surface tension of a composition of components of the coating material for imprint pretreatment, except a solvent, is higher than a surface tension of a composition of a component of the imprint resist, except a solvent.

11. An imprint resist, which is suitable for use in the set of claim 9.

12. A pretreatment method for performing an imprint through arrangement of a curable composition on a substrate, the method comprising coating a top of the substrate with the coating material for imprint pretreatment of claim 8.

13. A pattern forming method for forming a pattern on a substrate, the method comprising a step of dispensing a liquid droplet of an imprint resist dropwise discretely onto the substrate coated with the coating material for imprint pretreatment of claim 8.

14. The method according to claim 5, wherein the processed substrate is a semiconductor device.

15. A pattern forming method, comprising:
  dispensing a droplet of an imprint resist discretely onto a liquid film of an imprint pretreatment coating on a substrate such that the droplet of the imprint resist spreads on the liquid film of the imprint pretreatment coating to yield a spread imprint resist, wherein the imprint pretreatment coating comprises a polymerizable compound and the imprint resist is a curable composition;
  contacting the spread imprint resist with a mold;
  irradiating the spread imprint resist and the imprint pretreatment coating with light to yield a cured layer; and
  releasing the mold from the cured layer,
  wherein a value Vr/Vc obtained by dividing a volume of the imprint resist per shot area (Vr) by a volume of the imprint pretreatment coating (Vc) is 4 to 15.

16. A method for manufacturing a semiconductor device, the method comprising:
  providing a liquid film of an imprint pretreatment coating on a substrate, wherein the imprint pretreatment coating comprises a polymerizable compound;
  dispensing a droplet of an imprint resist onto the liquid film of the imprint pretreatment coating such that the droplet of the imprint resist spreads on the liquid film of the imprint pretreatment coating to yield a spread imprint resist, wherein the imprint resist is a polymerizable composition;
  contacting the spread imprint resist with a mold;
  irradiating the spread imprint resist and the imprint pretreatment coating with light to yield a cured layer;
  separating the mold from the cured layer; and
  etching the substrate via the cured layer;
  wherein a value Vr/Vc obtained by dividing a volume of the imprint resist per shot area (Vr) by a volume of the imprint pretreatment coating (Vc) is 4 to 15.

17. The method according to claim 16, wherein:
  providing the liquid film of the imprint pretreatment coating comprises coating the substrate using an inkjet method, dip coating, air knife coating, curtain coating, wire bar coating, gravure coating, extrusion coating, spin coating, or a slit scan method, and
  dispensing the droplet of the imprint resist onto the liquid film of the imprint pretreatment coating using an inkjet method.

* * * * *